(12) United States Patent
Park et al.

(10) Patent No.: US 11,742,294 B2
(45) Date of Patent: Aug. 29, 2023

(54) INTERPOSERS AND SEMICONDUCTOR PACKAGES INCLUDING THE SAME

(71) Applicant: Samsung Electronics Co., Ltd., Suwon-si (KR)

(72) Inventors: Jongho Park, Cheonan-si (KR); Seunghwan Kim, Anyang-si (KR); Junyoung Oh, Seoul (KR); Yonghyun Kim, Asan-si (KR); Yongkwan Lee, Hwaseong-si (KR); Junga Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/306,290

(22) Filed: May 3, 2021

(65) Prior Publication Data

US 2022/0093519 A1   Mar. 24, 2022

(30) Foreign Application Priority Data

Sep. 22, 2020   (KR) ........................ 10-2020-0122434

(51) Int. Cl.
*H01L 23/13* (2006.01)
*H01L 23/538* (2006.01)
(Continued)

(52) U.S. Cl.
CPC ...... *H01L 23/5385* (2013.01); *H01L 23/3128* (2013.01); *H01L 23/49816* (2013.01); *H01L 23/49822* (2013.01); *H01L 23/49833* (2013.01); *H01L 23/49838* (2013.01); *H01L 23/5386* (2013.01); *H01L 24/16* (2013.01); *H01L 24/73* (2013.01); *H01L 25/105* (2013.01); *H01L 2224/16227* (2013.01);
(Continued)

(58) Field of Classification Search
CPC ...... H01L 23/13; H01L 23/528; H01L 23/485
See application file for complete search history.

(56) References Cited

U.S. PATENT DOCUMENTS 8,399,992 B2   3/2013   Park et al.
9,431,374 B2   8/2016   Lee et al.
(Continued)

FOREIGN PATENT DOCUMENTS

JP   2004022610 A   *   1/2004
JP   2011192893 A   *   9/2011
(Continued)

*Primary Examiner* — Michele Fan
(74) *Attorney, Agent, or Firm* — Harness, Dickey & Pierce, P.L.C.

(57) ABSTRACT

A semiconductor package includes a first package substrate; a first semiconductor chip on the first package substrate; a first conductive connector on the first package substrate; and an interposer including a central portion on the first semiconductor chip and an outer portion having the first conductive connector attached thereto. The central portion of the interposer includes a bottom surface defining a recess from a bottom surface of the outer portion of the interposer in a vertical direction that is perpendicular to a top surface of the first package substrate. A thickness in the vertical direction of the outer portion of the interposer is greater than a thickness in the vertical direction of the central portion of the interposer.

20 Claims, 15 Drawing Sheets

(51) Int. Cl.
  *H01L 23/00* (2006.01)
  *H01L 23/498* (2006.01)
  *H01L 25/10* (2006.01)
  *H01L 23/31* (2006.01)

(52) U.S. Cl.
  CPC ............... *H01L 2224/16237* (2013.01); *H01L 2224/73204* (2013.01); *H01L 2225/1023* (2013.01); *H01L 2225/1041* (2013.01); *H01L 2225/1058* (2013.01)

(56) References Cited

U.S. PATENT DOCUMENTS

| | | | |
|---|---|---|---|
| 9,640,513 B2* | 5/2017 | Lee | H01L 25/105 |
| 10,297,552 B2 | 5/2019 | Kim et al. | |
| 2006/0249829 A1* | 11/2006 | Katagiri | H01L 24/50 |
| | | | 257/E25.013 |
| 2008/0029858 A1* | 2/2008 | Merilo | H01L 23/3128 |
| | | | 257/668 |
| 2009/0032927 A1 | 2/2009 | Kim et al. | |
| 2015/0179561 A1* | 6/2015 | Wu | H01L 23/3157 |
| | | | 174/255 |
| 2018/0145061 A1* | 5/2018 | Jeong | H01L 23/5385 |
| 2019/0088505 A1 | 3/2019 | Won et al. | |
| 2020/0058611 A1* | 2/2020 | Lin | H01L 23/3171 |
| 2020/0118972 A1* | 4/2020 | Lee | H01L 24/49 |

FOREIGN PATENT DOCUMENTS

| | | |
|---|---|---|
| JP | 2017112325 A | 6/2017 |
| JP | 6514808 B2 | 5/2019 |
| KR | 20110115780 A | 10/2011 |
| KR | 101362714 B1 | 2/2014 |
| KR | 101573314 B1 | 12/2015 |
| KR | 101624973 B1 | 5/2016 |

\* cited by examiner

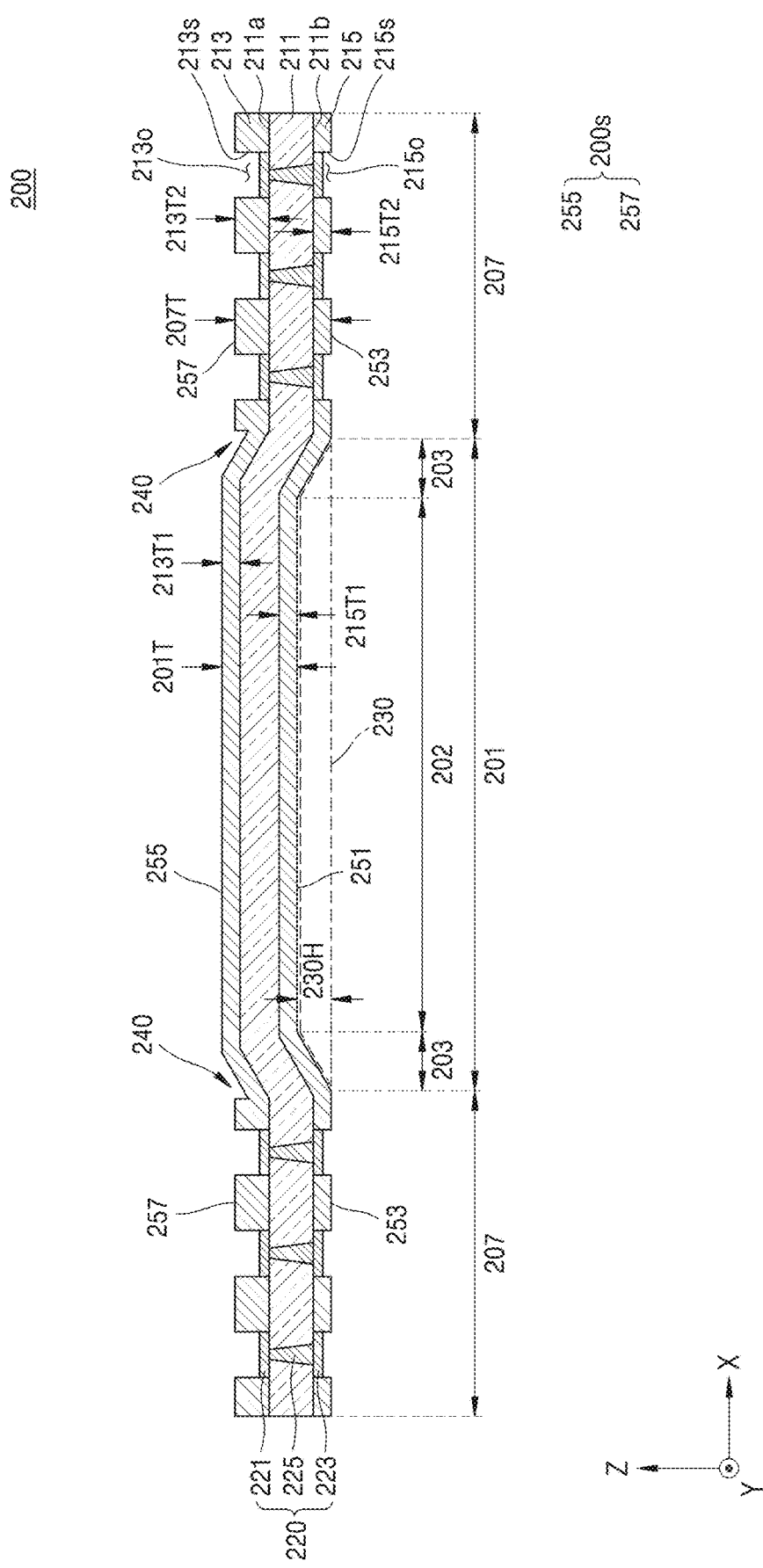

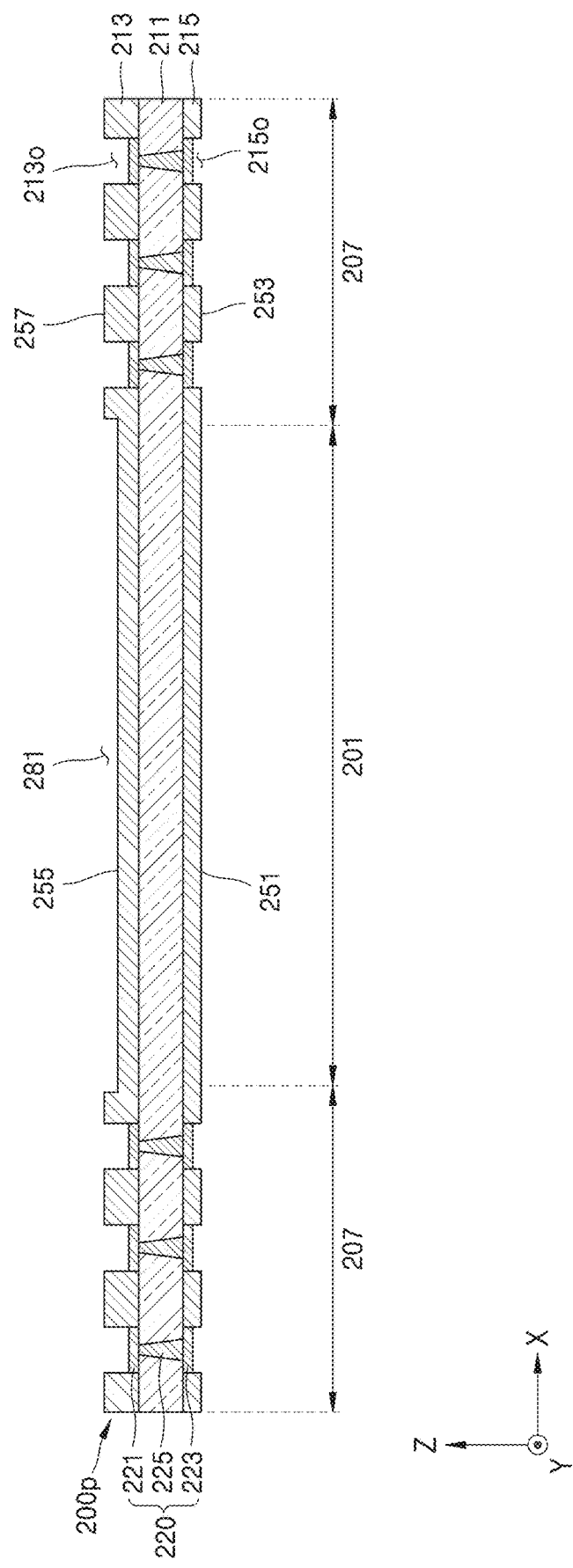

INTERPOSERS AND SEMICONDUCTOR PACKAGES INCLUDING THE SAME

CROSS-REFERENCE TO RELATED APPLICATION

This application is based on and claims priority under 35 U.S.C. § 119 to Korean Patent Application No. 10-2020-0122434, filed on Sep. 22, 2020, in the Korean Intellectual Property Office, the disclosure of which is incorporated by reference herein in its entirety.

BACKGROUND

The inventive concepts relate to interposers and semiconductor packages including the same.

With the rapid development of the electronics industry and user needs, electronic equipment has become compact and multifunctionalized and has a high capacity. Accordingly, a semiconductor package including a plurality of semiconductor chips is required. Therefore, a semiconductor package for connecting highly integrated semiconductor chips, which have an increased number of connectors for input/output, to each other using an interposer is being developed.

SUMMARY

The inventive concepts provide interposers and semiconductor packages including the same.

According to some example embodiments, a semiconductor package may include a first package substrate, a first semiconductor chip on the first package substrate, a first conductive connector on the first package substrate, and an interposer. The interposer may include a central portion on the first semiconductor chip, and an outer portion contacting the first conductive connector. The central portion of the interposer may include a bottom surface facing the first semiconductor chip, the bottom surface defining a recess from a bottom surface of the outer portion of the interposer in a vertical direction that is perpendicular to a top surface of the first package substrate. A thickness in the vertical direction of the outer portion of the interposer may be greater than a thickness in the vertical direction of the central portion of the interposer.

According to some example embodiments, a semiconductor package may include a first package substrate, a first semiconductor chip on the first package substrate, a first conductive connector on the first package substrate and isolated from direct contact with the first semiconductor chip, an interposer, an insulating filler between the first package substrate and the interposer, a second conductive connector, a second package substrate on the interposer through the second conductive connector, and a second semiconductor chip on the second package substrate. The interposer may include a central portion on the first semiconductor chip, and an outer portion contacting the first conductive connector. The insulating filler may be in contact with both the first semiconductor chip and the first conductive connector. The second conductive connector may be on the outer portion of the interposer. A distance in a vertical direction between a bottom surface of the outer portion of the interposer and a top surface of the first package substrate may be less than a distance in the vertical direction between a top surface of the first semiconductor chip and the top surface of the first package substrate. The vertical direction may be perpendicular to the top surface of the first package substrate. A top surface of the central portion of the interposer and a top surface of the outer portion of the interposer may collectively define a groove in a top surface of the interposer at a border between the top surface of the central portion of the interposer and the top surface of the outer portion of the interposer.

According to some example embodiments, an interposer for a semiconductor package may include an outer portion including lower conductive pads at a bottom surface of the outer portion and upper conductive pads at a top surface of the outer portion, and a central portion protruding from the outer portion in a vertical direction that is perpendicular to the top surface of the outer portion. The central portion may include a bottom surface defining a recess from the bottom surface of the outer portion in the vertical direction. A thickness in the vertical direction of the outer portion may be greater than a thickness in the vertical direction of the central portion. A top surface of the central portion and the top surface of the outer portion may collectively define a groove in a top surface of the interposer at a border between the top surface of the central portion and the top surface of the outer portion.

BRIEF DESCRIPTION OF THE DRAWINGS

Example embodiments of the inventive concepts will be more clearly understood from the following detailed description taken in conjunction with the accompanying drawings in which:

FIG. 2 is a cross-sectional view of an interposer in FIG. 1 according to some example embodiments;

FIGS. 9A, 9B, 9C, 9D, and 9E are cross-sectional views of a manufacturing method of a semiconductor package according to some example embodiments.

DETAILED DESCRIPTION

Figure 1:
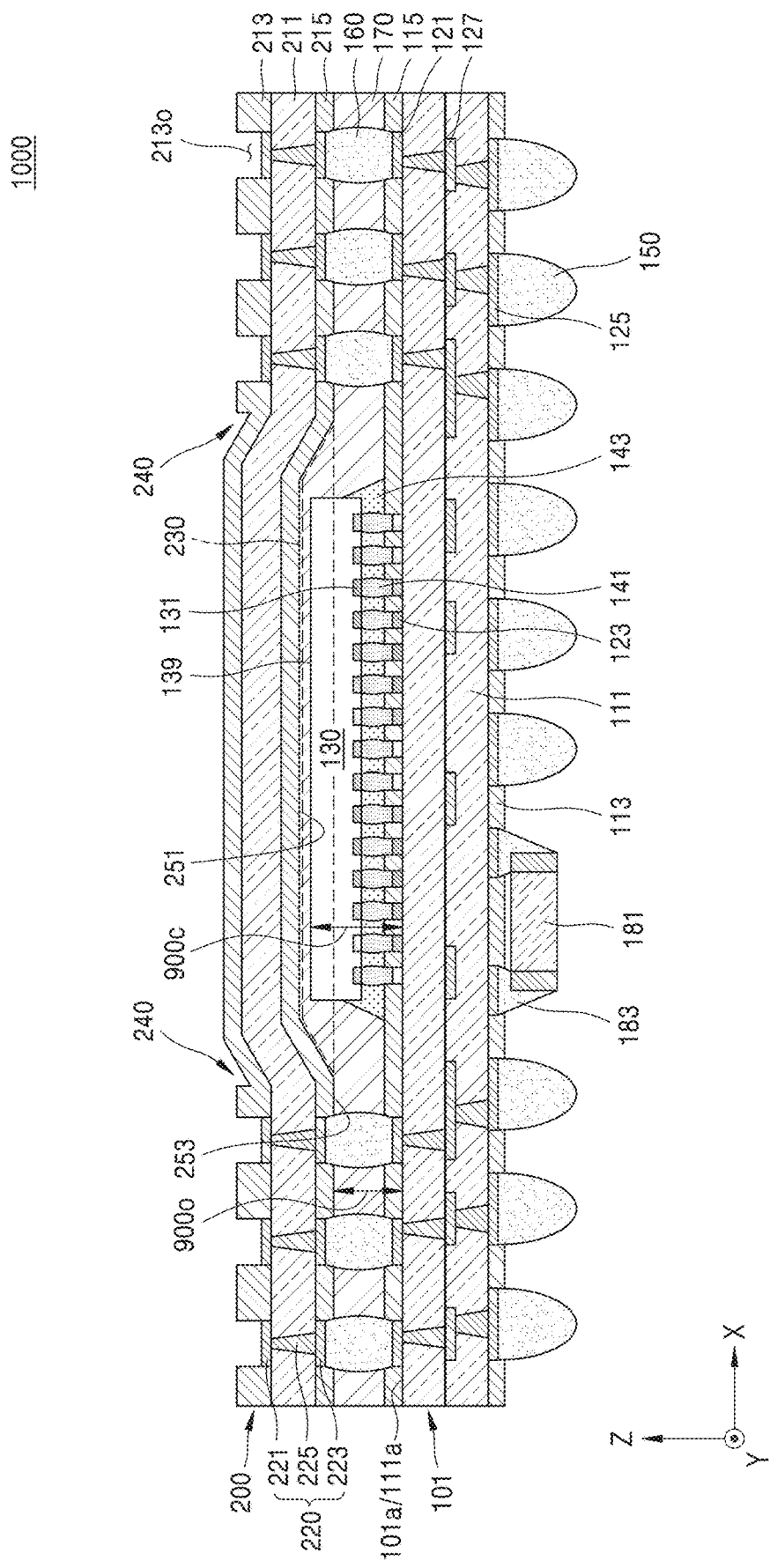
FIG. 1 is a cross-sectional view of a semiconductor package according to some example embodiments.

Hereinafter, some example embodiments will be described with reference to the attached drawings. In the drawings, like numerals denote like elements and redundant descriptions thereof will be omitted.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a cross-sectional view of a semiconductor package 1000 according to some example embodiments. FIG. 2 is a cross-sectional view of an interposer 200 in FIG. 1.

Referring to FIGS. 1 and 2, the semiconductor package 1000 may include a first package substrate 101, a first semiconductor chip 130, a first conductive connector 160, an insulating filler 170, and the interposer 200.

For example, the first package substrate 101 may include a printed circuit board (PCB). The first package substrate 101 may include a substrate base 111 including at least one material selected from phenol resin, epoxy resin, and polyimide. The first package substrate 101 may include a first upper substrate pad 121 and a second upper substrate pad 123, which are on a top surface 111a of the substrate base 111, and a lower substrate pad 125 on a bottom surface of the substrate base 111. An internal wiring pattern 127 configured to electrically connect the first upper substrate pad 121, the second upper substrate pad 123, and the lower substrate pad 125 with one another may be formed in the substrate base 111. The internal wiring pattern 127 may include a line pattern, which extends in a horizontal direction (e.g., an X direction or a Y direction) in the first package substrate 101, and a via pattern, which extends in a vertical direction (e.g., a Z direction) in the first package substrate 101.

An upper substrate protection layer 115 may be formed on the top surface 111a of the substrate base 111 (where the top surface 111a of the substrate base 111 may be the top surface 101a of the first package substrate 101), and a lower substrate protection layer 113 may be formed on the bottom surface of the substrate base 111. A first opening, which exposes the first upper substrate pad 121, and a second opening, which exposes the second upper substrate pad 123, may be formed in the upper substrate protection layer 115. An opening, which exposes the lower substrate pad 125, may be formed in the lower substrate protection layer 113. For example, the upper substrate protection layer 115 and the lower substrate protection layer 113 may include solder resist.

For example, the first upper substrate pad 121, the second upper substrate pad 123, and the lower substrate pad 125 may include metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof but are not limited thereto.

The first upper substrate pad 121 may include a pad, to which the first conductive connector 160 is attached, and the second upper substrate pad 123 may include a pad, to which a chip connection bump 141, such as a micro bump, is attached. As shown in at least FIG. 1, the first conductive connector 160 may be on (e.g., directly or indirectly on) the first package substrate 101. The first conductive connector 160 may be isolated from direct contact with the first semiconductor chip 130. The first conductive connector 160 may be connected to the first upper substrate pad 121 through the first opening of the upper substrate protection layer 115, and the chip connection bump 141 may be connected to the second upper substrate pad 123 through the second opening of the upper substrate protection layer 115.

The lower substrate pad 125 may function as a pad, to which an external connector 150 is attached. The external connector 150 may be connected to the lower substrate pad 125 through the opening of the lower substrate protection layer 113. For example, the external connector 150 may include a solder ball. The external connector 150 may electrically connect the semiconductor package 1000 to an external device.

In some example embodiments, at least one passive element 181 may be attached to the bottom surface of the first package substrate 101. The passive element 181 may include a surface-mount device (SMD). For example, the passive element 181 may include a capacitor or a resistor. A terminal of the passive element 181 may be electrically connected to the lower substrate pad 125 through a connector 183 on the lower substrate pad 125.

The first semiconductor chip 130 may be mounted on (e.g., directly or indirectly on) the first package substrate 101. The first semiconductor chip 130 may be between the first package substrate 101 and the interposer 200 in the vertical direction (e.g., the Z direction) perpendicular to the top surface 101a of the first package substrate 101.

It will be understood that an element described herein to be "on" another element may be above or beneath the other element. Additionally, an element described herein to be "on" another element may be directly on the other element, such that the element is in direct contact with the other element, or may be indirectly on the other element, such that the element is isolated from direct contact with the other element by one or more interposing structures and/or spaces.

The first semiconductor chip 130 may include a semiconductor substrate, which has an active side and an inactive side opposite the active side, and a semiconductor device layer on the active side of the semiconductor substrate. The first semiconductor chip 130 may include a bottom surface and a top surface 139 opposite to each other, and a chip pad 131 may be on the bottom surface of the first semiconductor chip 130. The bottom surface of the first semiconductor chip 130 may be near the active side of the semiconductor substrate, and the top surface 139 of the first semiconductor chip 130 may be near the inactive side of the semiconductor substrate. The chip pad 131 of the first semiconductor chip 130 may be electrically connected to the semiconductor device layer through an interconnect structure (not shown) in the first semiconductor chip 130.

In some example embodiments, the first semiconductor chip 130 may include a memory chip. The first semiconductor chip 130 may include a volatile memory chip and/or a non-volatile memory chip. For example, the volatile memory chip may include dynamic random access memory (DRAM), static RAM (SRAM), thyristor RAM (TRAM), zero capacitor RAM (ZRAM), or twin transistor RAM (TTRAM). For example, the non-volatile memory chip may include flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

In some example embodiments, the first semiconductor chip 130 may include a non-memory chip. For example, the first semiconductor chip 130 may include a logic chip. The first semiconductor chip 130 may include an artificial intelligence semiconductor, a microprocessor, a graphics processor, a signal processor, a network processor, a chip set, an audio codec, a video codec, or an application processor.

The first semiconductor chip 130 may be mounted on the first package substrate 101 in a face-down manner or a flip chip manner. In other words, the first semiconductor chip 130 may be mounted on the first package substrate 101 such that the bottom surface of the first semiconductor chip 130 faces the first package substrate 101, wherein the chip pad 131 is on the bottom surface of the first semiconductor chip 130. The chip pad 131 of the first semiconductor chip 130 may be electrically connected to the second upper substrate pad 123 through the chip connection bump 141. The chip pad 131 of the first semiconductor chip 130 may be used as a terminal for transmission of an input/output (I/O) data signal of the first semiconductor chip 130 or a terminal for the power supply and/or the ground of the first semiconductor chip 130.

An underfill material layer 143 may be between the first semiconductor chip 130 and the first package substrate 101 to surround the chip connection bump 141. For example, the underfill material layer 143 may include epoxy resin formed using a capillary underfill process. In some example embodiments, the underfill material layer 143 may include a non-conductive film. In some example embodiments, a space between the first semiconductor chip 130 and the first package substrate 101 may be directly filled with the insulating filler 170 using molded underfill process. In this case, the underfill material layer 143 may be omitted.

The interposer 200 may be on (e.g., directly or indirectly on) the first package substrate 101 and the first semiconductor chip 130. The interposer 200 may include a base insulating layer 211, an upper protective insulating layer 213, a lower protective insulating layer 215, and an interconnect structure 220.

The base insulating layer 211 may include at least one material selected from phenol resin, epoxy resin, and polyimide. For example, the base insulating layer 211 may include at least one material selected from polyimide, frame retardant 4 (FR4), tetrafunctional epoxy, polyphenylene ether, epoxy/polyphenylene oxide, bismaleimide triazine (BT), thermount, cyanate ester, and liquid crystal polymer.

The interconnect structure 220 may include an upper conductive pad 221 on (e.g., directly or indirectly on) the top surface 211a of the base insulating layer 211, a lower conductive pad 223 on (e.g., directly beneath) the bottom surface 211b of the base insulating layer 211, and a conductive via 225 passing through the base insulating layer 211. The upper conductive pad 221 may include a pad, to which a second conductive connector (290 in FIG. 7) is attached (e.g., connected), wherein the second conductive connector 290 electrically connects the interposer 200 to a substrate mounted on the interposer 200. The lower conductive pad 223 may include a pad, to which the first conductive connector 160 is attached, wherein the first conductive connector 160 electrically connects the first package substrate 101 to the interposer 200. The conductive via 225 may be in contact with the upper conductive pad 221 and the lower conductive pad 223 and configured to electrically connect the upper conductive pad 221 to the lower conductive pad 223. The lower conductive pad 223 may be connected to the first conductive connector 160. As shown in at least FIGS. 1-2, it will be understood that the outer portion 207 of the interposer 200 may include lower conductive pads 223 at the bottom surface 253 (e.g., at least partially defining the bottom surface 253) of the outer portion 207 and upper conductive pads 221 at a top surface 257 (e.g., at least partially defining the top surface 257) of the outer portion 207.

For example, the interconnect structure 220 may include metal, such as Cu, Al, W, Ti, Ta, In, Mo, Mn, Co, Sn, Ni, Mg, Re, Be, Ga, or Ru, or an alloy thereof but is not limited thereto.

The upper protective insulating layer 213 may be on (e.g., directly or indirectly above) the top surface 211a of the base insulating layer 211, and the lower protective insulating layer 215 may be on (e.g., directly or indirectly beneath) the bottom surface 211*b* of the base insulating layer 211, the bottom surface 211*b* being opposite to the top surface 211*a*. The upper protective insulating layer 213 may cover the top surface of the base insulating layer 211 and include (e.g., may include one or more inner surfaces 213*s* that at least partially define) an upper opening 213*o*, which exposes the upper conductive pad 221 and which may be at least partially filled with the second conductive connector 221 as shown in at least FIG. 8. The lower protective insulating layer 215 may cover the bottom surface of the base insulating layer 211 and include (e.g., may include one or more inner surfaces 215*s* that at least partially define) a lower opening 215*o*, which exposes the lower conductive pad 223 and which may be at least partially filled with the first conductive connector 160. For example, the upper protective insulating layer 213 and the lower protective insulating layer 215 may include solder resist.

As shown, the upper protective insulating layer 213 may include multiple inner surfaces 213*s* that at least partially define separate, respective upper openings 213*o* exposing multiple upper conductive pads 221, and the lower protective insulating layer 215 may include multiple inner surfaces 215*s* that at least partially define separate, respective lower openings 215*o* exposing multiple lower conductive pads 223.

The interposer 200 may include a central portion 201 and an outer portion 207. The central portion 201 and the outer portion 207 of the interposer 200 may respectively refer to different portions of the interposer 200 and may be connected to each other. The central portion 201 of the interposer 200 may be on (e.g., above) the first semiconductor chip 130. As shown in at least FIGS. 1, 2 and 3A-3B, the central portion 201 of the interposer 200 may be on (e.g., above) the first semiconductor chip 130 such that the first semiconductor chip 130 may overlap the central portion 201 of the interposer 200 in the vertical direction (e.g., the Z direction) perpendicular to the top surface 101*a* of the first package substrate 101. As described herein, it will be understood that in some example embodiments the vertical direction (e.g., the Z direction) may be understood to be a direction that is perpendicular to the top surface 257 of the outer portion 207 of the interposer 200. In the plan view, the central portion 201 of the interposer 200 may cover (e.g., overlap in the Z direction) the first semiconductor chip 130. A footprint of the central portion 201 of the interposer 200 (e.g., area of the interposer 200 in a horizontal plane extending parallel to the top surface 101*a* of the first package substrate 101 (and/or parallel to the top surface 257 of the outer portion 207 of the interposer 200), e.g., a plane extending in the X direction and Y direction) is greater than a footprint of the first semiconductor chip 130 (e.g., area of the first semiconductor chip 130 in the horizontal plane). The first conductive connector 160 and/or the second conductive connector 290 may be attached to the outer portion 207 of the interposer 200. The outer portion 207 of the interposer 200 may include the lower conductive pad 223 connected to the first conductive connector 160 and the upper conductive pad 221 connected to the second conductive connector 290. Accordingly, and as shown in at least FIGS. 1, 2, and 3A-3B, the outer portion 207 of the interposer 200 may contact (e.g., may be in direct contact with, directly on, etc.) the first conductive connector 160.

The central portion 201 of the interposer 200 may have a first thickness 201T in the vertical direction (e.g., the Z direction), and the outer portion 207 of the interposer 200 may have a second thickness 207T in the vertical direction (e.g., the Z direction). The first thickness 201T may correspond to a distance between a top surface 255 and a bottom surface 251 of the central portion 201 of the interposer 200 in the vertical direction (e.g., the Z direction), and the second thickness 207T may correspond to a distance between a top surface 257 and a bottom surface 253 of the outer portion 207 of the interposer 200 in the vertical direction (e.g., the Z direction). In some example embodiments, a thickness (e.g., maximum thickness) in the vertical direction of the outer portion 207 of the interposer 200 (e.g., the second thickness 207T) may be greater than a thickness (e.g., maximum thickness) in the vertical direction of the central portion 201 of the interposer 200 (e.g., the first thickness 201T). In some example embodiments, the first thickness 201T of the central portion 201 of the interposer 200 may be about 90 micrometers (μm) to about 120 μm. In some example embodiments, the second thickness 207T of the outer portion 207 of the interposer 200 may be between about 95 μm and about 150 μm.

In some example embodiments, the second thickness 207T of the outer portion 207 of the interposer 200 may be greater than the first thickness 201T of the central portion 201 of the interposer 200. For example, a difference between the second thickness 207T of the outer portion 207 of the interposer 200 and the first thickness 201T of the central portion 201 of the interposer 200 may be between about 5 μm and about 30 μm. For example, when the first thickness 201T of the central portion 201 of the interposer 200 is 100 μm, the second thickness 207T of the outer portion 207 of the interposer 200 may be between about 105 μm and about 130 μm.

The upper protective insulating layer 213 in the central portion 201 of the interposer 200 may have a third thickness 213T1 in the vertical direction (e.g., the Z direction), and the upper protective insulating layer 213 in the outer portion 207 of the interposer 200 may have a fourth thickness 213T2 in the vertical direction (e.g., the Z direction). For example, the third thickness 213T1 may be between about 10 μm and about 20 μm. For example, the fourth thickness 213T2 may be between about 15 μm and about 100 μm. In some example embodiments, the fourth thickness 213T2 may be between about 15 μm and about 40 μm.

In some example embodiments, the fourth thickness 213T2 in the vertical direction (e.g., the Z direction) of the upper protective insulating layer 213 in the outer portion 207 of the interposer 200 may be greater than the third thickness 213T1 in the vertical direction (e.g., the Z direction) of the upper protective insulating layer 213 in the central portion 201 of the interposer 200. For example, a difference between the fourth thickness 213T2 of the upper protective insulating layer 213 in the outer portion 207 of the interposer 200 and the third thickness 213T1 of the upper protective insulating layer 213 in the central portion 201 of the interposer 200 may be between about 5 μm and about 30 μm.

When the fourth thickness 213T2 of the upper protective insulating layer 213 in the outer portion 207 of the interposer 200 is greater than the third thickness 213T1 of the upper protective insulating layer 213 in the central portion 201 of the interposer 200, a height in the vertical direction of the upper opening 213*o* of the upper protective insulating layer 213, which may be the same as the fourth thickness 213T2 in the vertical direction of the upper protective insulating layer 213 in the outer portion 207, may be greater than a height in the vertical direction of the lower opening 215*o* of the lower protective insulating layer 215, which may be the same as the thickness 215T2 in the vertical direction of the lower protective insulating layer 215 in the outer portion 207. In other words, a height of a side wall of the upper protective insulating layer 213, which defines the upper opening 213o, may be greater than a height of a side wall of the lower protective insulating layer 215, which defines the lower opening 215o.

In some example embodiments, the difference between the second thickness 207T of the outer portion 207 of the interposer 200 and the first thickness 201T of the central portion 201 of the interposer 200 may be equal to the difference between the fourth thickness 213T2 of the upper protective insulating layer 213 in the outer portion 207 of the interposer 200 and the third thickness 213T1 of the upper protective insulating layer 213 in the central portion 201 of the interposer 200. In other words, when the thickness of the base insulating layer 211 and the thickness of the lower protective insulating layer 215 is uniform throughout the central portion 201 and the outer portion 207 of the interposer 200, the thickness of the upper protective insulating layer 213 is different between the central portion 201 and the outer portion 207 of the interposer 200, and accordingly, the second thickness 207T of the outer portion 207 of the interposer 200 may be different from the first thickness 201T of the central portion 201 of the interposer 200.

In some example embodiments, the fourth thickness 213T2 in the vertical direction (e.g., Z direction) of the upper protective insulating layer 213 in the outer portion 207 of the interposer 200 may be greater than a thickness 215T2 in the vertical direction (e.g., Z direction) of the lower protective insulating layer 215 in the outer portion 207 of the interposer 200.

In some example embodiments, the third thickness 213T1 of the upper protective insulating layer 213 in the central portion 201 of the interposer 200 may be equal to a thickness of 215T1 of the lower protective insulating layer 215 in the central portion 201 of the interposer 200.

The central portion 201 of the interposer 200 may protrude upward from the outer portion 207 of the interposer 200 in a direction away from the top surface 139 of the first semiconductor chip 130. For example, the bottom surface 251 of the central portion 201 of the interposer 200 may protrude from the bottom surface 253 of the outer portion 207 of the interposer 200. In some example embodiments, the protruding shape of the interposer 200 may be substantially achieved by the central portion of the base insulating layer 211 that protrudes upward from the outer portion of the base insulating layer 211.

Because the central portion 201 of the interposer 200 has a protruding shape with respect to the outer portion 207 of the interposer 200, a recess 230 may be provided in the central portion 201 of the interposer 200. In other words, the central portion 201 of the interposer 200 may include the recess 230 in the bottom surface 251 facing the top surface 139 of the first semiconductor chip 130 and thus facing the first semiconductor chip 130 such that the bottom surface 251 and the top surface 139 are opposing surfaces. The recess 230 may be defined as a space formed as the bottom surface 251 of the central portion 201 of the interposer 200 is recessed from the bottom surface 253 of the outer portion 207 of the interposer 200. Restated, the central portion 201 of the interposer 200 may have a bottom surface 251 that defines a recess 230 in the vertical direction (e.g., Z direction) from the bottom surface 253 of the outer portion 207, the recess 230 having a maximum vertical height 230H from the bottom surface 253 of the outer portion 207 of the interposer 200 in the vertical direction (e.g., Z direction). For example, a vertical height 230H of the recess 230, which is measured from the bottom surface 253 of the outer portion 207 of the interposer 200 in the vertical direction (e.g., Z direction), may be between about 10 μm and about 100 μm. In some example embodiments, the vertical height 230H of the recess 230 may be between about 10 μm and about 30 μm.

In some example embodiments, a portion of the first semiconductor chip 130 may be accommodated in the recess 230 (e.g., may be at least partially located within the recess 230, may at least partially extend into the recess 230, etc.). When an upper portion of the first semiconductor chip 130 is accommodated in the recess 230, the top surface 139 of the first semiconductor chip 130 may be at a higher level than the bottom surface 253 of the outer portion 207 of the interposer 200. In other words, a distance between the top surface of the first package substrate 101 and the top surface 139 of the first semiconductor chip 130 in the vertical direction (e.g., the Z direction) may be greater than a distance between the top surface of the first package substrate 101 and the bottom surface 253 of the outer portion 207 of the interposer 200 in the vertical direction (e.g., the Z direction).

The central portion 201 of the interposer 200 may include a first portion 202, which extends to be substantially parallel with the top surface 101a of the first package substrate 101, and a second portion 203, which extends between the first portion 202 and the outer portion 207 of the interposer 200. The first portion 202 may overlap the first semiconductor chip 130 (e.g., overlap the top surface 139 of the first semiconductor chip 130) in the vertical direction (e.g., the Z direction). As shown in at least FIG. 2, the second portion 203 may extend with a bend or a slope between the first portion 202 and the outer portion 207 of the interposer 200 and connect the first portion 202 to the outer portion 207 of the interposer 200. The bottom surface of the first portion 202 may extend to be substantially parallel with, and opposing, the top surface 139 of the first semiconductor chip 130, and the bottom surface of the second portion 203 may extend with a slope between the bottom surface of the first portion 202 and the bottom surface 253 of the outer portion 207 of the interposer 200. The bottom surface of the second portion 203 may connect the bottom surface of the first portion 202 to the bottom surface 253 of the outer portion 207 of the interposer 200, which are respectively at different levels.

In some example embodiments, a groove 240 may be formed near the border between the top surface 255 of the central portion 201 of the interposer 200 and the top surface 257 of the outer portion 207 of the interposer 200. In detail, the groove 240 may be formed in a portion of the upper protective insulating layer 213, at which the second portion 203 of the central portion 201 of the interposer 200 meets the outer portion 207 of the interposer 200. The groove 240 may be formed as the central portion 201 of the interposer 200, which is relatively thin, protrudes upward from the outer portion 207 of the interposer 200. In some example embodiments, the groove 240 may be understood to be a groove in the top surface 200s of the interposer 200 which is collectively defined, by the top surface 257 of the outer portion 207 of the interposer 200 and the top surface 255 of the central portion 201 of the interposer 200, at an intersection of (e.g., border between, boundary between, etc.) the top surface 257 of the outer portion 207 of the interposer 200 and the top surface 255 of the central portion 201 of the interposer 200, where the top surfaces 255 and 257 collectively at least partially define the top surface 200s of the interposer 200.

The first conductive connector 160 may be extended between the outer portion 207 of the interposer 200 and the first package substrate 101. The first conductive connector 160 may be configured to electrically connect the interposer 200 to the first package substrate 101. The first conductive connector 160 may have a pillar shape extending between the lower conductive pad 223 of the interposer 200 and the first upper substrate pad 121 of the first package substrate 101. A lower portion of the first conductive connector 160 may be in contact with the first upper substrate pad 121 of the first package substrate 101. An upper portion of the first conductive connector 160 may fill the lower opening 215o of the lower protective insulating layer 215 and be in contact with the lower conductive pad 223. For example, the first conductive connector 160 may include a conductive material such as solder or Cu.

The insulating filler 170 may be on the first package substrate 101. The insulating filler 170 may protect the first package substrate 101, the first semiconductor chip 130, the first conductive connector 160, and the interposer 200 from external impacts. The insulating filler 170 may cover at least a portion of each of the first package substrate 101, the first semiconductor chip 130, the first conductive connector 160, and the interposer 200. For example, the insulating filler 170 may cover the top surface of the first package substrate 101, the side wall and top surface 139 of the first semiconductor chip 130, the side wall of the first conductive connector 160, and the bottom surface of the interposer 200. The insulating filler 170 may fill the space between the bottom surface 251 of the central portion 201 of the interposer 200 and the top surface 139 of the first semiconductor chip 130. Accordingly, the insulating filler 170 may be between the first package substrate 101 and the interposer 200 (e.g., directly therebetween), and the insulating filler 170 may be in contact with (e.g., may directly contact) both the first semiconductor chip 130 and the first conductive connector 160.

In some example embodiments, the insulating filler 170 may include epoxy-group molding resin or polyimide-group molding resin. For example, the insulating filler 170 may include an epoxy molding compound (EMC).

According to some example embodiments, because the interposer 200 has a bent structure, in which the outer portion 207 is closer to the first package substrate 101 than the central portion 201, first conductive connectors 160 may have a relatively low height and be arranged at a fine pitch. Furthermore, because the first conductive connectors 160 are arranged at a fine pitch, the number of first conductive connectors 160 that may be arranged in a limited area or space may be increased, and data transmission performance between the first semiconductor chip 130 on the first package substrate 101 and another semiconductor device mounted on the interposer 200 may be enhanced.

Figure 3A:
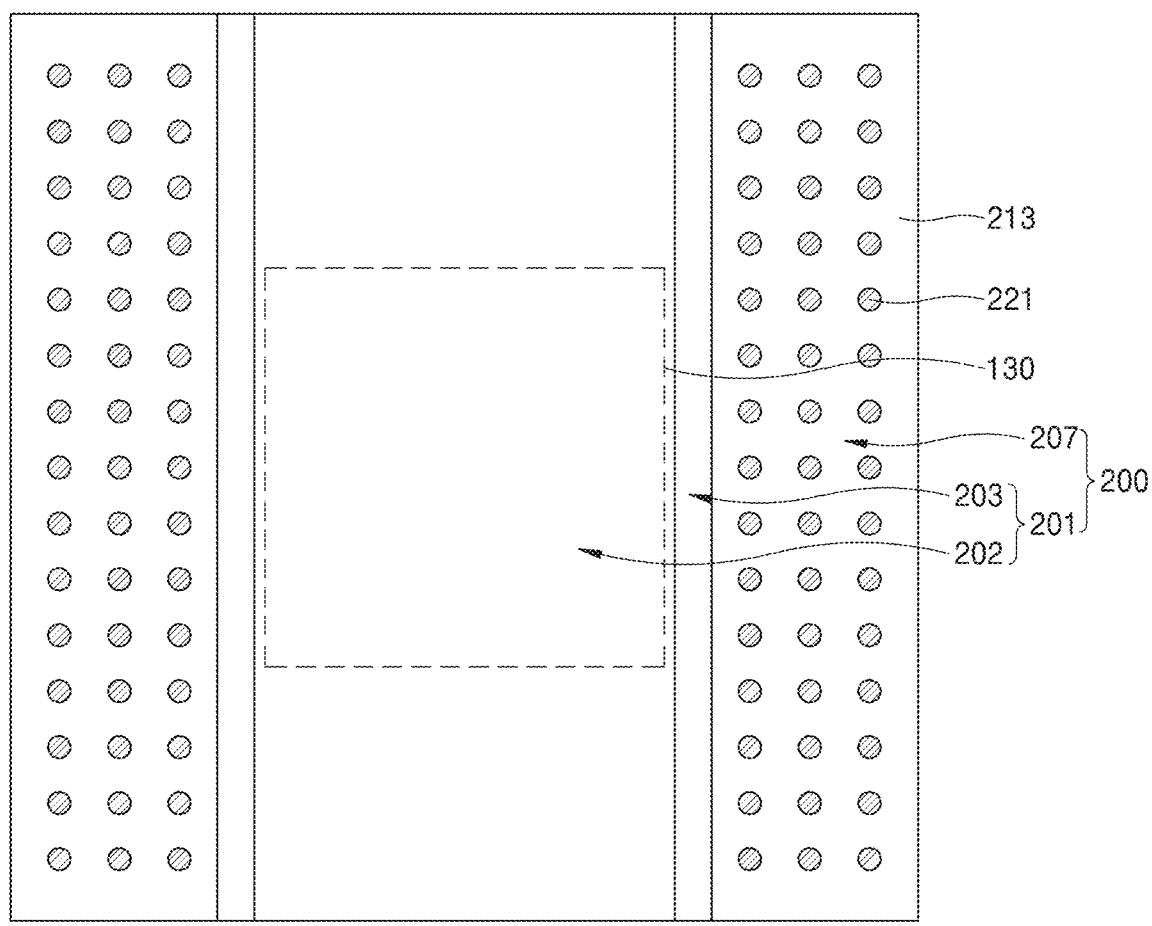
FIGS. 3A and 3B are respectively plan views of the interposer in FIGS. 1 and 2 according to some example embodiments.
Figure 3B:
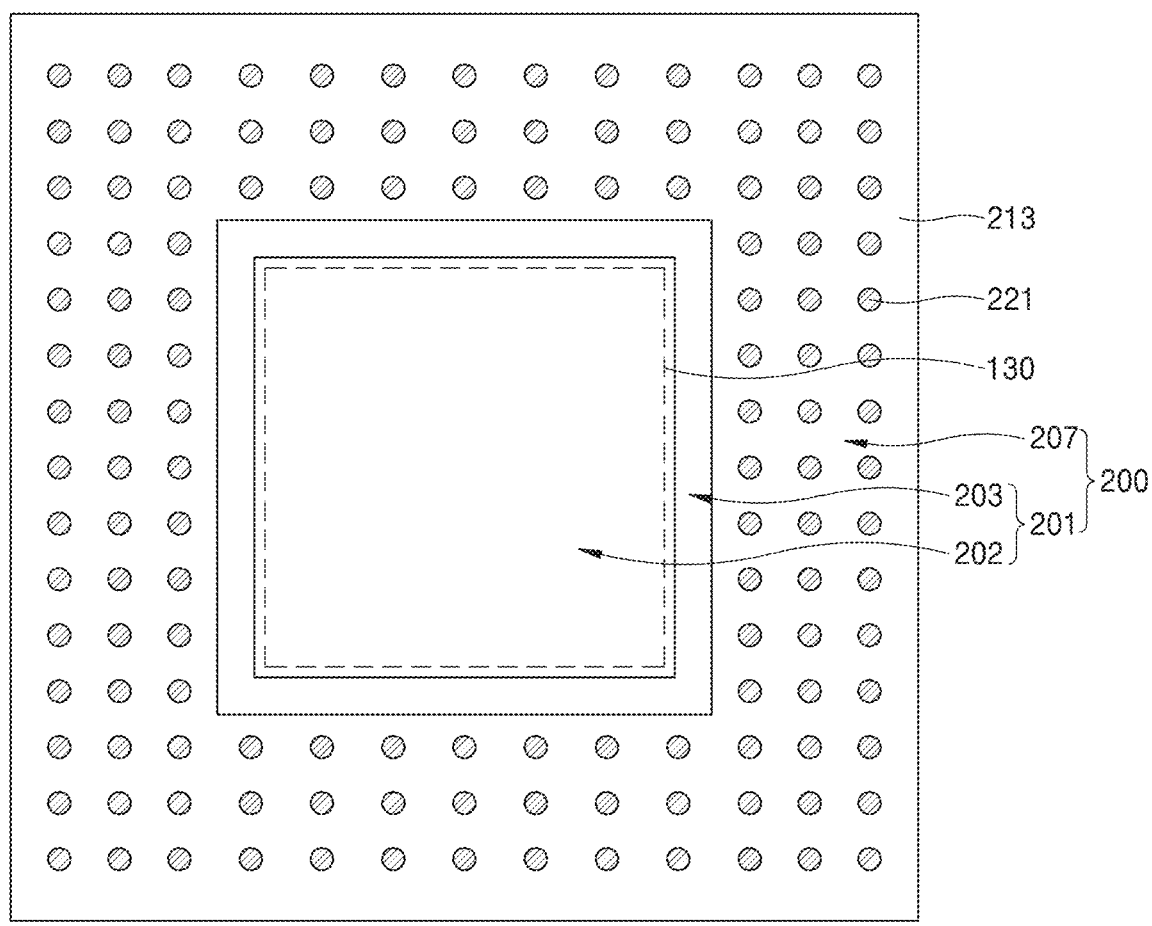

FIGS. 3A and 3B are respectively plan views of the interposer 200 in FIGS. 1 and 2.

Referring to FIGS. 1, 2, and 3A, the central portion 201 of the interposer 200 may extend from a first edge of the interposer 200 to a second edge opposite the first edge. The outer portion 207 of the interposer 200 may include two portions separated from each other with the central portion 201 of the interposer 200 therebetween. In this case, the recess 230 of the interposer 200 may extend from the first edge of the interposer 200 to the second edge opposite the first edge. The groove 240 in the top surface of the interposer 200 may extend from the first edge of the interposer 200 to the second edge opposite the first edge.

Referring to FIGS. 1, 2, and 3B, the outer portion 207 of the interposer 200 may surround the central portion 201 of the interposer 200. For example, as viewed from above, the outer portion 207 of the interposer 200 may have a ring shape surrounding the central portion 201 of the interposer 200. In this case, the recess 230 of the interposer 200 may have substantially a similar size to the first semiconductor chip 130. The groove 240 in the top surface of the interposer 200 may have a ring shape continuously extending along the border between the central portion 201 of the interposer 200 and the outer portion 207 of the interposer 200.

Figure 4:
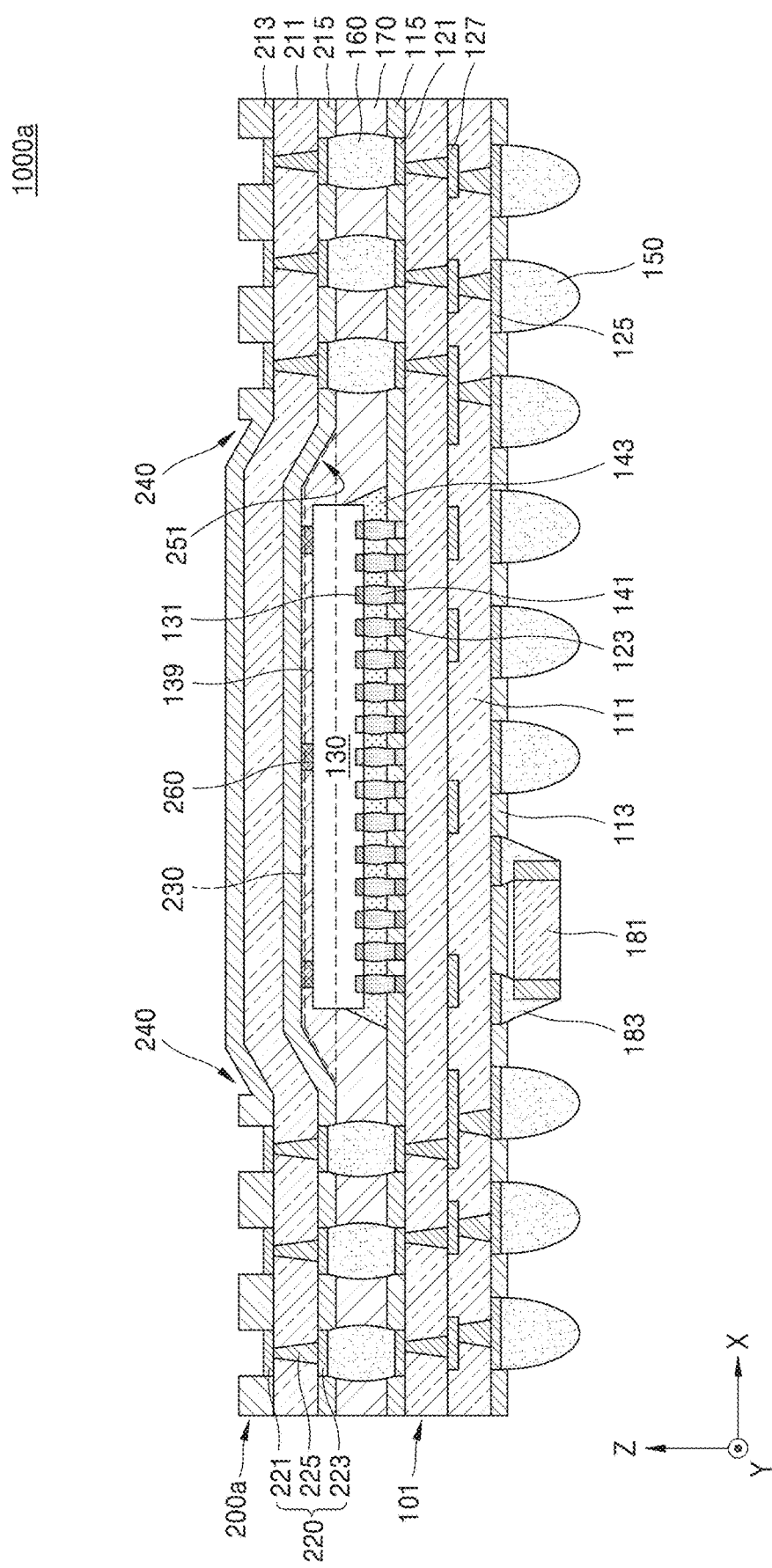
FIG. 4 is a cross-sectional view of a semiconductor package according to some example embodiments.

FIG. 4 is a cross-sectional view of a semiconductor package 1000a according to some example embodiments. The semiconductor package 1000a of FIG. 4 may be substantially the same as or similar to the semiconductor package 1000 described with reference to FIGS. 1 and 2, except that an interposer 200a further includes a spacer 260. For convenience of description, the description will be focused on differences between the semiconductor package 1000a and the semiconductor package 1000 described with reference to FIGS. 1 and 2.

Referring to FIGS. 2 and 4, the interposer 200a may include the spacer 260 in the central portion 201 of the interposer 200a. The spacer 260 may have a pillar shape, which protrudes from a surface of the lower protective insulating layer 215 in the central portion 201 of the interposer 200a (e.g., from the bottom surface 251 of the central portion 201) toward the top surface 139 of the first semiconductor chip 130. In some example embodiments, the spacer 260 may extend directly between the bottom surface 251 and the top surface 139 and be in direct contact with each of the bottom surface 251 and the top surface 139.

In some example embodiments, a plurality of spacers 260 may be arranged on the bottom surface of the interposer 200a. For example, as shown in FIG. 4, the spacers 260 may be in the recess 230 and arranged in a two-dimensional array on a surface of the lower protective insulating layer 215 in the central portion 201 of the interposer 200a. The bottom surface of each of the spacers 260 may be in contact with the top surface 139 of the first semiconductor chip 130, and the side wall of each of the spacers 260 may be covered with the insulating filler 170. As shown in at least FIG. 4, the spacers 260 may be on (e.g., directly beneath) the lower protective insulating layer 215 in the central portion 201 of the interposer 200.

The spacers 260 may separate the bottom surface 251 of the central portion 201 of the interposer 200a from the top surface 139 of the first semiconductor chip 130. During formation of the insulating filler 170, the spacers 260 may support the interposer 200a such that the bottom surface 251 of the central portion 201 of the interposer 200a is spaced apart from the top surface 139 of the first semiconductor chip 130. A distance between the bottom surface 251 of the central portion 201 of the interposer 200a and the top surface 139 of the first semiconductor chip 130 may be greater than or equal to the height of the spacers 260. The spacers 260 may define a minimum distance between the bottom surface 251 of the central portion 201 of the interposer 200a and the top surface 139 of the first semiconductor chip 130.

In some example embodiments, the spacers 260 may include the same material (e.g., a same total material composition) as the lower protective insulating layer 215. For example, the spacers 260 may include solder resist. For example, the spacers 260 and the lower protective insulating layer 215 may be simultaneously formed by forming a solder resist material layer covering the bottom surface of the base insulating layer 211 and patterning the solder resist material layer.

In some example embodiments, the spacers 260 may include a different material than the lower protective insulating layer 215. For example, the lower protective insulating layer 215 may include solder resist, and the spacers 260 may include epoxy-group resin or polyimide-group resin. For example, the spacers 260 may be formed by attaching a dotted structure to the surface of the lower protective insulating layer 215.

Figure 5:
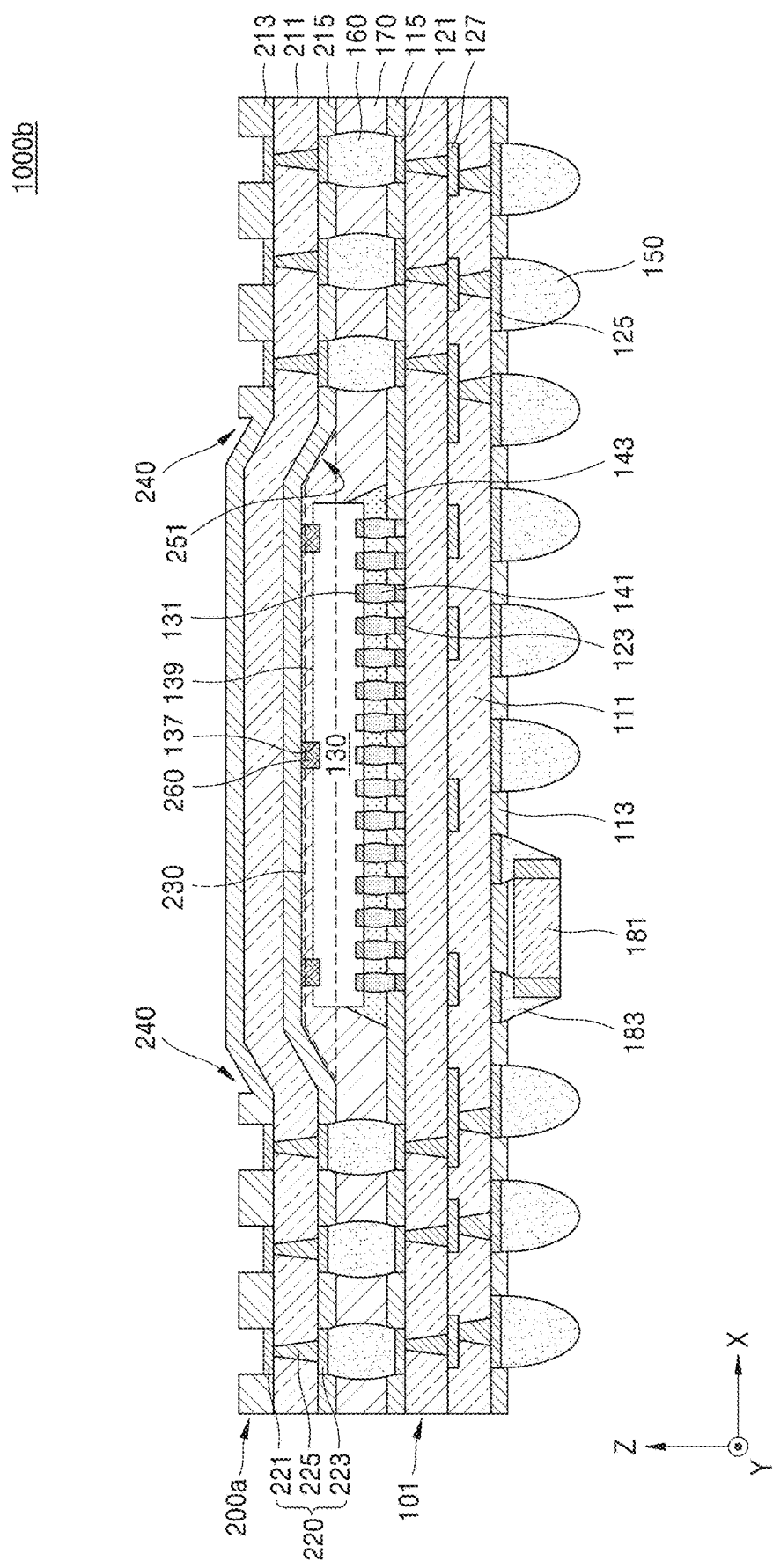
FIG. 5 is a cross-sectional view of a semiconductor package according to some example embodiments.

FIG. 5 is a cross-sectional view of a semiconductor package 1000b according to some example embodiments. For convenience of description, the description will be focused on differences between the semiconductor package 1000b and the semiconductor package 1000a described with reference to FIG. 4.

Referring to FIG. 5, the first semiconductor chip 130 may include a groove 137 configured to partially accommodate a spacer 260 of the interposer 200a. Restated, the top surface 139 of the first semiconductor chip 130 may define a groove 137 configured to at least partially accommodate the spacer 260 such that at least a portion of the spacer 260 partially or completely fills the groove 137 The groove 137 of the first semiconductor chip 130 may be in the top surface 139 of the first semiconductor chip 130. The groove 137 of the first semiconductor chip 130 may be provided in a silicon substrate of the first semiconductor chip 130. The groove 137 of the first semiconductor chip 130 may be located and have a shape in correspondence to the spacer 260 of the interposer 200a such that the spacer 260 of the interposer 200a may be partially inserted into the groove 137. Because the spacer 260 of the interposer 200a is inserted into the groove 137 of the first semiconductor chip 130, the interposer 200a may be firmly fixed to the first semiconductor chip 130. In addition, because the interposer 200a may be aligned with the first semiconductor chip 130 when the spacer 260 of the interposer 200a is inserted into the groove 137 of the first semiconductor chip 130, misalignment between the interposer 200a and the first semiconductor chip 130 may be prevented.

Figure 6A:
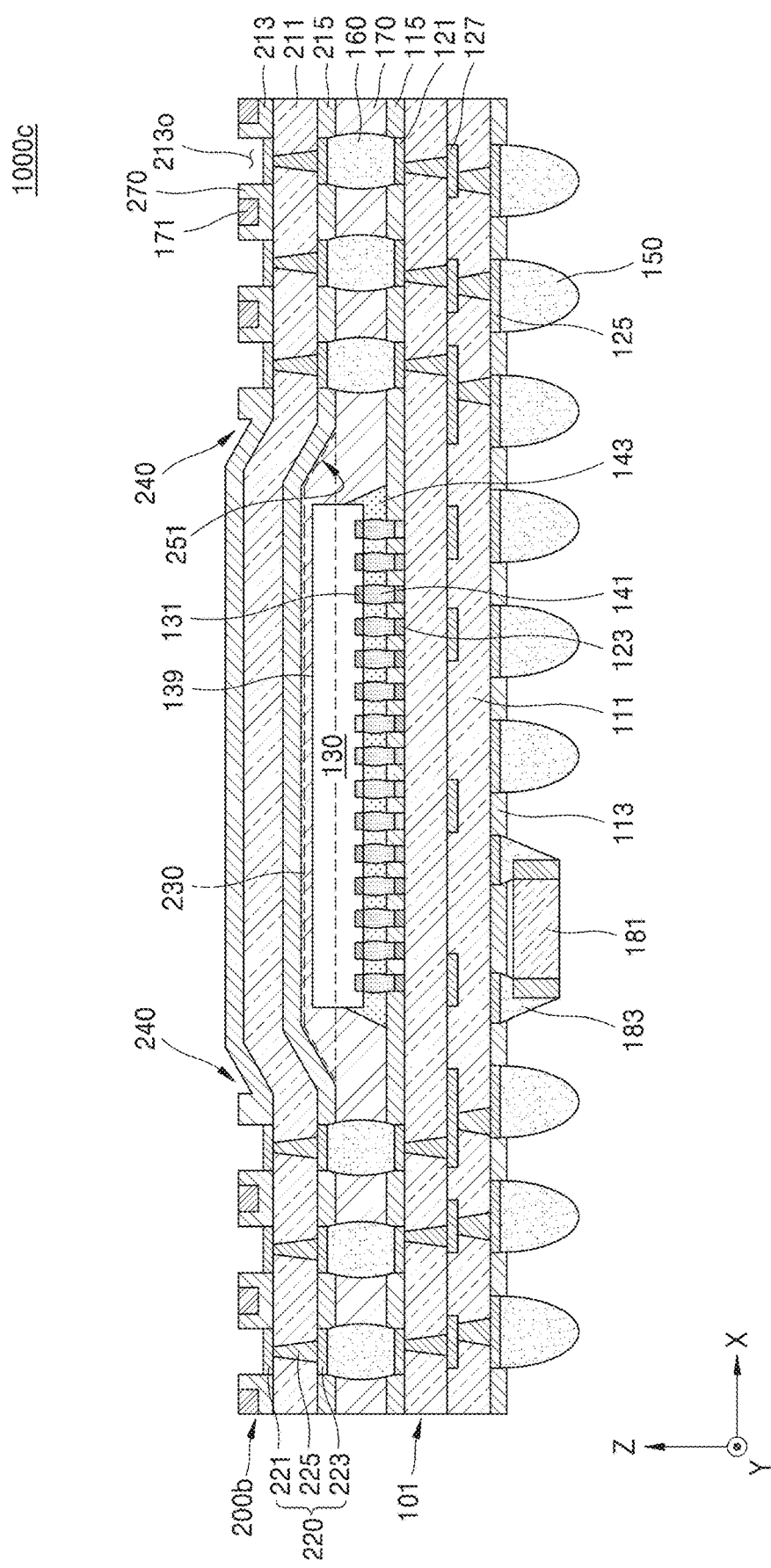
FIG. 6A is a cross-sectional view of a semiconductor package according to some example embodiments.
Figure 6B:
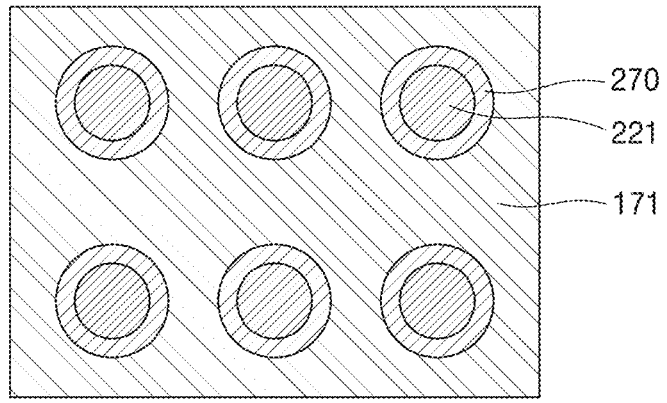
FIG. 6B is a plan view of a portion of an interposer included in the semiconductor package of FIG. 6A.

FIG. 6A is a cross-sectional view of a semiconductor package 1000c according to some example embodiments. FIG. 6B is a plan view of a portion of an interposer 200b included in the semiconductor package 1000c of FIG. 6A. For convenience of description, the description will be focused on differences between the semiconductor package 1000c and the semiconductor package 1000 described with reference to FIGS. 1 and 2.

Referring to FIGS. 2, 6A, and 6B, the interposer 200b may include a dam structure 270, which defines the upper opening(s) 213o exposing the upper conductive pad(s) 221 and thus extending along an edge of the upper conductive pad 221. As shown, the dam structure 270 may surround each of the upper conductive pads 221 (e.g., surround each of the upper conductive pads 221 in a horizontal plane extending the X direction and Y direction). The dam structure 270 may prevent the upper conductive pad 221 from being blocked by other materials. The dam structure 270 may protrude from a surface of the upper protective insulating layer 213 around the dam structure 270. In this case, the top surface of the outer portion 207 of the interposer 200b may be defined by the top surface of the dam structure 270.

The dam structure 270 may have a ring shape, which continuously extends along the edge of the upper conductive pad 221 and at least partially defines the upper opening 213o. As viewed from above, the dam structure 270 may have a shape surrounding the edge of the upper conductive pad 221. In some example embodiments, the dam structure 270 may have a circular ring shape in a top view. In some example embodiments, the dam structure 270 may have a polygonal ring shape, such as a triangular, quadrangular, or pentagonal ring shape, in a top view.

In some example embodiments, the dam structure 270 may have a shape corresponding to the shape of the upper conductive pad 221. For example, as shown in FIG. 6B, when the top surface of the upper conductive pad 221 is circular, the dam structure 270 may extend along the edge of the upper conductive pad 221 and thus have a circular ring shape.

In some example embodiments, the dam structure 270 may have a different shape than the upper conductive pad 221. For example, when the top surface of the upper conductive pad 221 is circular, the dam structure 270 may have a polygonal ring shape.

At least two dam structures 270 may be provided on the interposer 200b to be separated from each other. The dam structures 270 may respectively extend along the edges of different upper conductive pads 221. For example, each of the dam structures 270 may surround the edge of each of a plurality of upper conductive pads 221, which are arranged in a two-dimensional array in the interposer 200b.

In some example embodiments, a dam structure 270 may correspond to a portion of the upper protective insulating layer 213 in the outer portion 207 of the interposer 200b. The dam structure 270 may be formed by patterning a solder resist material layer covering the base insulating layer 211 and may include the same material as the upper protective insulating layer 213.

In some example embodiments, the dam structure 270 may include a different material than the upper protective insulating layer 213. For example, the dam structure 270 may include an insulating material such as epoxy-group resin or polyimide-group resin. For example, the dam structure 270 may include a conductive material. For example, the dam structure 270 may include metal or a conductive polymer. For example, the dam structure 270 may include metal such as Cu, Ni, Co, gold (Au), or W. In some example embodiments, the dam structure 270 may include a material, which has a higher melting point than a material of the second conductive connector 290 (in FIG. 7) attached to an upper conductive pad 221. For example, when the second conductive connector 290 includes solder, the dam structure 270 may include metal such as Cu, Ni, or Co. When the dam structure 270 includes a material having a higher melting point than a material of the second conductive connector 290, the dam structure 270 may not melt, compared to the second conductive connector 290, during a reflow process, which is performed to bond the second conductive connector 290 to the upper conductive pad 221. Therefore, the second conductive connector 290 may be stably supported by the dam structure 270 during the reflow process.

An insulating material 171 may fill between dam structures 270. The insulating material 171 may be in at least a portion of the outer portion 207 of the interposer 200b. For example, the insulating material 171 may fill between dam structures 270 in a portion of the outer portion 207 of the interposer 200b, wherein the portion of the outer portion 207 of the interposer 200b is adjacent to a side wall of the interposer 200b, and the insulating material 171 does not fill the upper opening 213o. The top surface of the insulating material 171 may be at the same level as or at a lower level than the top surface of the dam structures 270.

The insulating material 171 may be formed as an insulating filling material partially flows into an upper portion of the interposer 200b in a filling process performed to form the insulating filler 170. In a process of forming the insulating filler 170, the insulating filling material that has flowed into the upper portion of the interposer 200*b* is blocked by the dam structures 270 so as not to flow into the upper opening 213*o* but to flow between the dam structures 270. When the insulating filling material is hardened, the insulating material 171 filling between the dam structures 270 may be formed.

Figure 7:
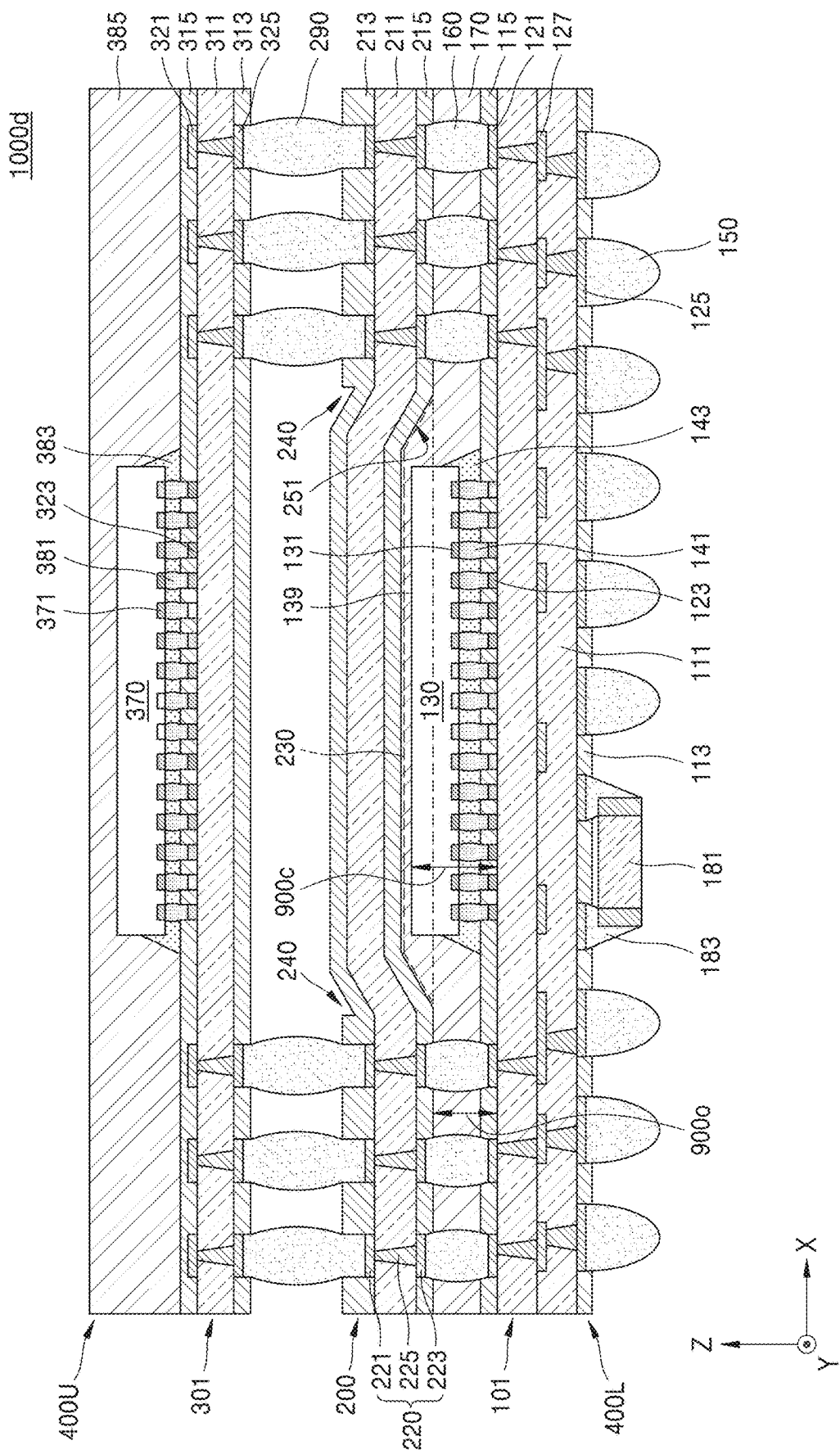
FIG. 7 is a cross-sectional view of a semiconductor package according to some example embodiments.

FIG. 7 is a cross-sectional view of a semiconductor package 1000*d* according to some example embodiments.

Referring to FIGS. 1, 2, and 7, the semiconductor package 1000*d* may include a lower package 400L and an upper package 400U. The semiconductor package 1000*d* may be of a package-on-package type, in which the upper package 400U is stacked on the lower package 400L.

Although it is illustrated in FIG. 7 that the lower package 400L corresponds to the semiconductor package 1000 described above with reference to FIGS. 1 and 2, the lower package 400L may correspond to any one of the semiconductor packages 1000*a*, 1000*b*, and 1000*c* described above with reference to FIGS. 4 through 6B.

The upper package 400U may include a second package substrate 301, a second semiconductor chip 370, and a molding layer 385.

For example, the second package substrate 301 may include a PCB. The second package substrate 301 may include a substrate base 311 including at least one material selected from phenol resin, epoxy resin, and polyimide. The second package substrate 301 may include a first upper substrate pad 321 and a second upper substrate pad 323, which are on the top surface of the substrate base 311, and a lower substrate pad 325 on the bottom surface of the substrate base 311. An internal wiring configured to electrically connect the first upper substrate pad 321, the second upper substrate pad 323, and the lower substrate pad 325 with one another may be formed in the substrate base 311. An upper substrate protection layer 315 may be formed on the top surface of the substrate base 311, and a lower substrate protection layer 313 may be formed on the bottom surface of the substrate base 311.

The second package substrate 301 may be mounted on (e.g., may be on, directly or indirectly) the interposer 200 through the second conductive connector 290, which is on (e.g., directly or indirectly on) the outer portion 207 of the interposer 200. The interposer 200 may include an upper conductive pad 221 connected to the second conductive connector 290. A dam structure 270 may extend along an edge of the upper conductive pad 221. The second conductive connector 290 may be connected to the upper conductive pad 221 of the interposer 200 and to the lower substrate pad 325 of the second package substrate 301 and thus electrically connect the upper conductive pad 221 of the interposer 200 to the lower substrate pad 325 of the second package substrate 301.

The second semiconductor chip 370 may be mounted on (e.g., may be on, directly or indirectly) the second package substrate 301. For example, a chip pad 371 of the second semiconductor chip 370 may be electrically connected to the second upper substrate pad 323 of the second package substrate 301 through a chip connection bump 381. An underfill material layer 383 may be between the second semiconductor chip 370 and the second package substrate 301 to surround the chip connection bump 381.

In some example embodiments, the first semiconductor chip 130 and the second semiconductor chip 370 may be of the same types. In some example embodiments, the first semiconductor chip 130 and the second semiconductor chip 370 may be of different types. For example, when the first semiconductor chip 130 is a logic chip, the second semiconductor chip 370 may be a memory chip. In some example embodiments, the second semiconductor chip 370 may be implemented by a high bandwidth memory (HBM) chip. In some example embodiments, the semiconductor package 1000*d* may be configured to operate as a single system by electrically connecting components, such as different types of semiconductor chips and passive elements, to one another.

The molding layer 385 may be arranged on the second package substrate 301 to at least partially cover the second semiconductor chip 370. For example, the molding layer 385 may include epoxy-group molding resin or polyimide-group molding resin. For example, the molding layer 385 may include an EMC.

According to some example embodiments, because the interposer 200 has a bent structure, in which the outer portion 207 is closer to the first package substrate 101 than the central portion 201, a distance between the central portion 201 of the interposer 200 and the upper package 400U may be decreased, and the total thickness of the semiconductor package 1000*d* of a package-on-package type may be reduced.

Figure 8:
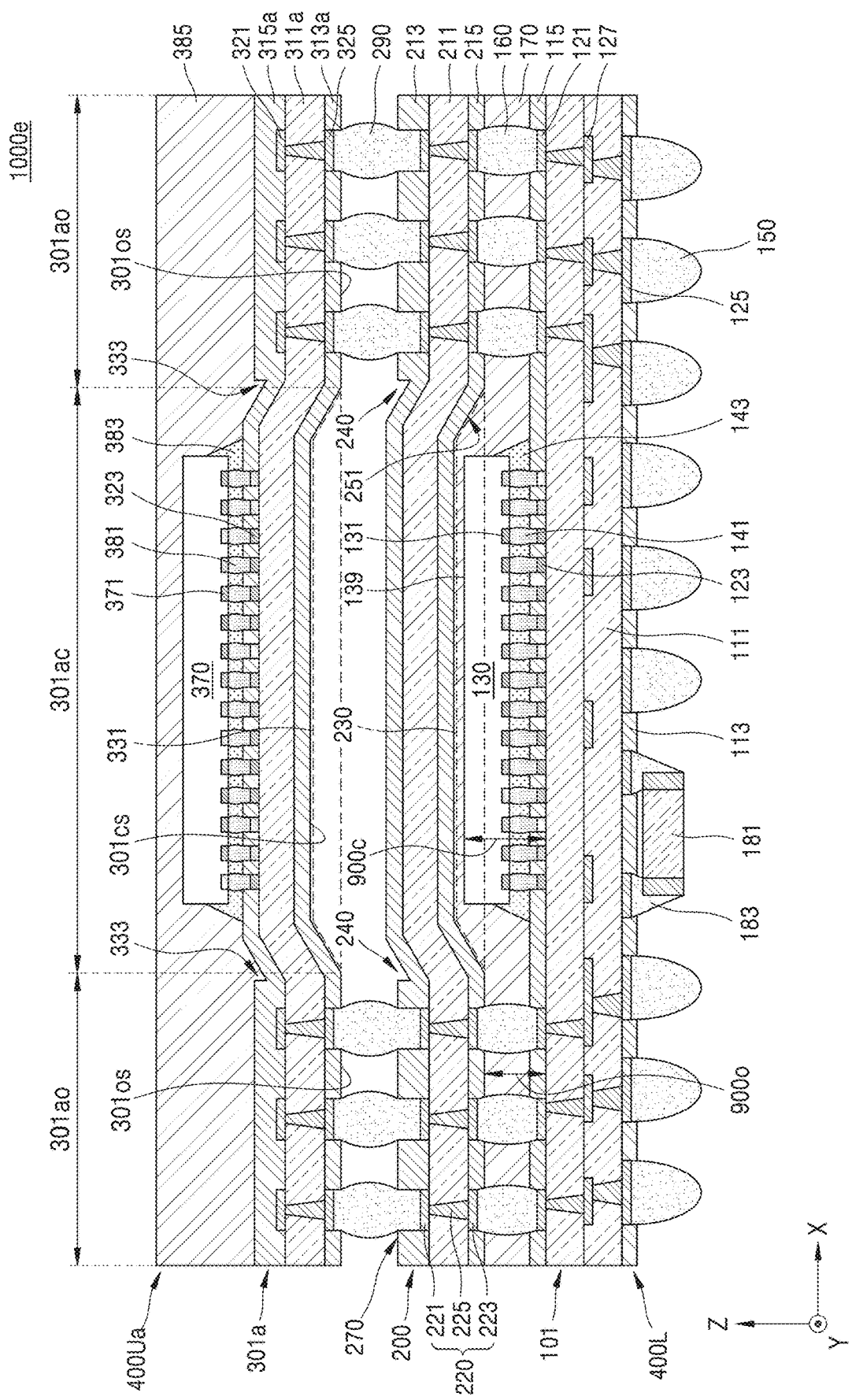
FIG. 8 is a cross-sectional view of a semiconductor package according to some example embodiments.

FIG. 8 is a cross-sectional view of a semiconductor package 1000*e* according to some example embodiments. For convenience of description, the description will be focused on differences between the semiconductor package 1000*e* and the semiconductor package 1000*d* described with reference to FIG. 7.

Referring to FIG. 8, the semiconductor package 1000*e* may include the lower package 400L and an upper package 400Ua. A second package substrate 301*a* of the upper package 400Ua may include a central portion 301*ac* and an outer portion 301*ao* around the central portion 301*ac*. The second semiconductor chip 370 may be mounted on the central portion 301*ac* of the second package substrate 301*a*, and the second conductive connector 290 may be attached to (e.g., may contact) the outer portion 301*ao* of the second package substrate 301*a*.

The second package substrate 301*a* may have a similar structure to the interposer 200 of FIG. 2. For example, the central portion 301*ac* of the second package substrate 301*a* may protrude upward from the outer portion 301*ao* thereof (e.g., in a direction away from the interposer 200, for example the Z direction) and may include a recess 331 in the bottom surface thereof, the bottom surface facing the interposer 200. Restated, a bottom surface 301*cs* of the central portion 301*ac* of the second package substrate 301*a* may define a recess 331 from a bottom surface 301*os* of the outer portion 301*ao* of the second package substrate 301*a* in the vertical direction, the bottom surface 301*cs* of the central portion 301*ac* of the second package substrate 301*a* facing the interposer 200. For example, the bottom surface of the central portion of the second package substrate 301*a* may protrude from the bottom surface of the outer portion 301*ao* of the second package substrate 301*a*. In some example embodiments, the protruding shape of the second package substrate 301*a* may be substantially achieved by a central portion of a substrate base 311*a* that protrudes upward from an outer portion of the substrate base 311*a*.

In some example embodiments, a thickness of an upper substrate protection layer 315*a* in the central portion of the second package substrate 301*a* may be less than a thickness of the upper substrate protection layer 315*a* in the outer portion of the second package substrate 301*a*.

In some example embodiments, the thickness of the substrate base 311*a* and the thickness of a lower substrate protection layer 313a may be substantially uniform throughout the central and outer portions of the second package substrate 301a.

A thickness of the outer portion of the second package substrate 301a may be greater than a thickness of the central portion of the second package substrate 301a. A groove 333 may be formed near the border between the top surface of the central portion of the second package substrate 301a and the top surface of the outer portion of the second package substrate 301a. In detail, the groove 333 may be formed in a portion of the upper substrate protection layer 315a, at which the central portion of the second package substrate 301a meets the outer portion of the second package substrate 301a. The groove 333 may be formed as the central portion of the second package substrate 301a, which is relatively thin, protrudes upward from the outer portion of the second package substrate 301a. The groove 333 may be filled with the molding layer 385.

According to some example embodiments, because the second package substrate 301a has a bent structure, in which the bottom surface of the outer portion of the second package substrate 301a is at a lower level than the bottom surface of the central portion of the second package substrate 301a, second conductive connectors 290 electrically connecting the outer portion 207 of the interposer 200 to the outer portion of the second package substrate 301a may be formed to have a relatively low height, and accordingly, the total thickness of the semiconductor package 1000e of a package-on-package type may be reduced. In addition, because the second conductive connectors 290 are arranged at a fine pitch, the number of second conductive connectors 290 that may be arranged in a limited area or space may be increased, and the performance of data transmission through the second conductive connectors 290 may be enhanced.

FIGS. 9A, 9B, 9C, 9D, and 9E are cross-sectional views of a manufacturing method of a semiconductor package according to some example embodiments. Hereinafter, a method of manufacturing the semiconductor package 1000d of FIG. 7 will be described with reference to FIGS. 9A through 9E.

Referring to FIG. 9A, an interposer 200p having a plate shape, which is substantially flat, is prepared. The bottom surface 251 of the central portion 201 of the interposer 200p may be substantially at the same level as the bottom surface 253 of the outer portion 207 of the interposer 200p. The interposer 200p may include the base insulating layer 211, the upper protective insulating layer 213, and the lower protective insulating layer 215.

The upper protective insulating layer 213 in the central portion 201 of the interposer 200p may include a trench 281. An area of the trench 281 may entirely or mostly occupy the central portion 201 of the interposer 200p. The top surface 255 of the central portion 201 of the interposer 200p, which is provided by the trench 281, may be at a lower level than the top surface 257 of the outer portion 207 of the interposer 200p.

Figure 9B:
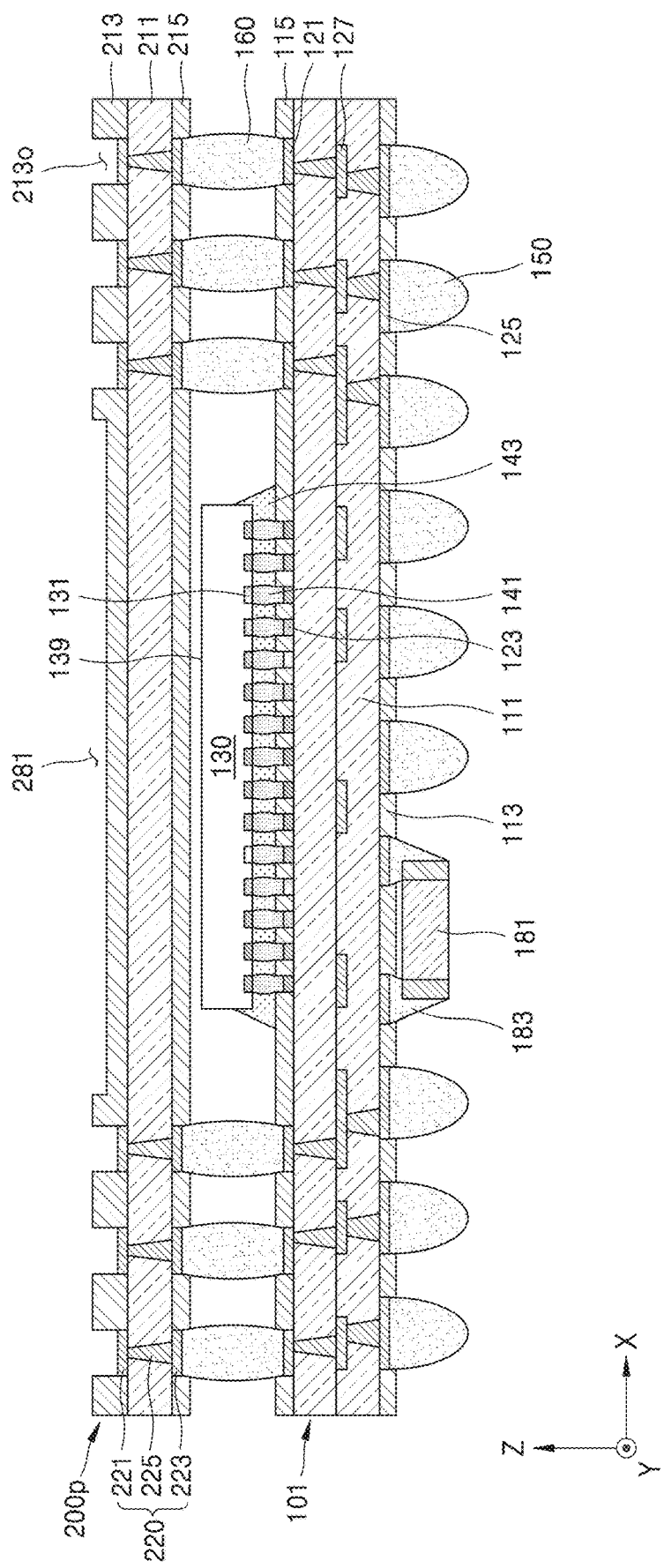

Referring to FIG. 9B, the interposer 200p is mounted on the first package substrate 101 using the first conductive connectors 160 arranged on the first package substrate 101.

Figure 9C:
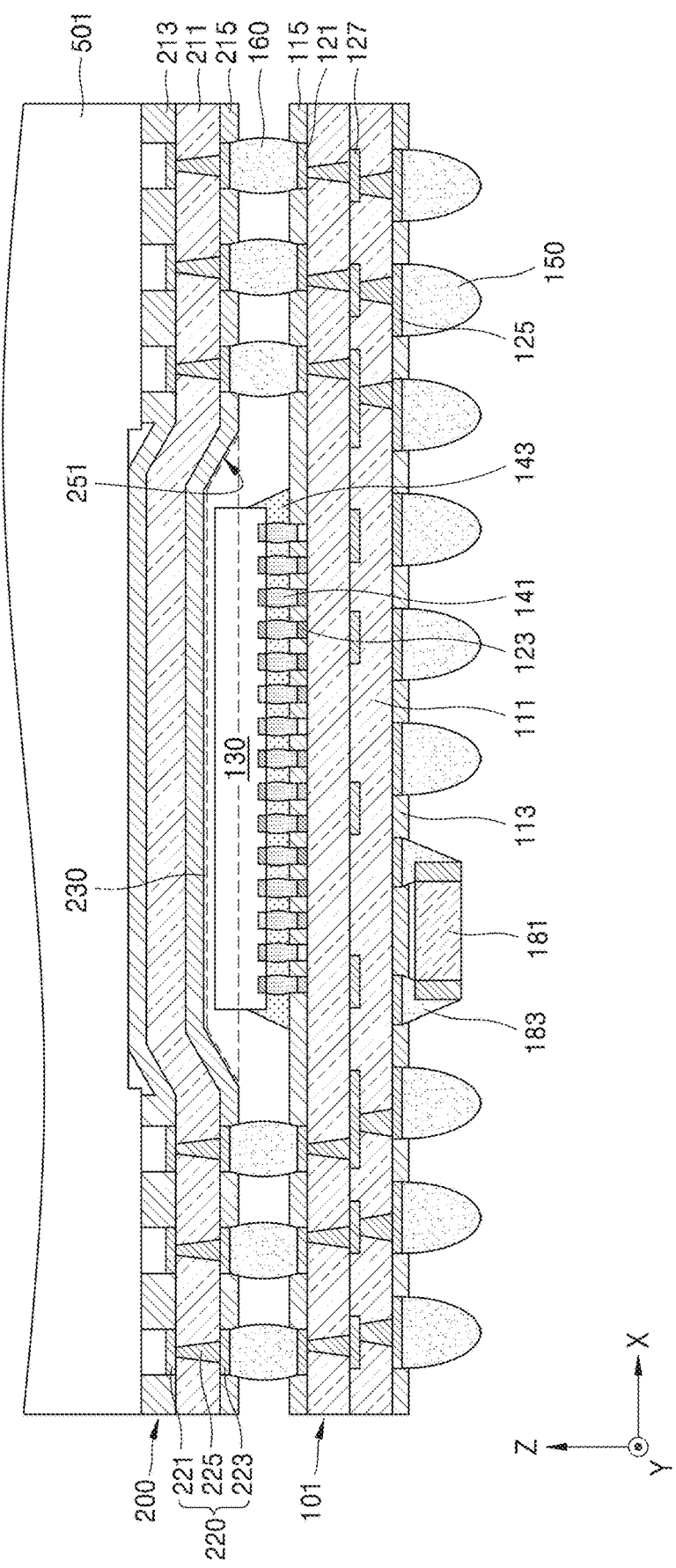

Referring to FIGS. 2, 9B, and 9C, the interposer 200p is transformed into the interposer 200 such that the central portion 201 protrudes from the outer portion 207. For example, the interposer 200p may be transformed into a desired shape using a mold 501 in a stamping process. In this case, the interposer 200p may include a material of which the shape may be changed by a stamping process for changing a shape using heat and pressure.

To form the interposer 200, the mold 501 may be located on the interposer 200p, which is flat, and the interposer 200p may be pressed by the mold 501 in an atmosphere having a higher temperature than room temperature. When the interposer 200p is pressed by the mold 501 such that the outer portion 207 of the interposer 200p is pressed downward, a portion near the border between the central portion 201 and the outer portion 207 of the interposer 200p may be bent so that the recess 230 may be formed below the central portion 201 of the interposer 200. As the central portion 201 of the interposer 200 protrudes upwards from the outer portion 207 of the interposer 200, the groove 240 may be formed near the border between the top surface 255 of the central portion 201 of the interposer 200 and the top surface 257 of the outer portion 207 of the interposer 200.

As shown in FIGS. 2 and 9C, the top surface 257 of the outer portion 207 of the interposer 200 may be at a lower level than the top surface of the first portion 202 of the central portion 201 of the interposer 200. However, in some example embodiments, the top surface 257 of the outer portion 207 of the interposer 200 may be at the same level as or at a higher level than the top surface of the first portion 202 of the central portion 201 of the interposer 200 by controlling the shape of the mold 501 or a changed height of the outer portion 207 of the interposer 200 using the mold 501.

In some example embodiments, the vertical height 230H of the recess 230 (e.g., height of the recess 230 in the vertical direction), which is measured from the bottom surface 253 of the outer portion 207 of the interposer 200, may be between about 10 μm and about 100 μm. When the vertical height 230H of the recess 230 is less than 10 μm, the total thickness of a semiconductor package of a package-on-package type may not be sufficiently reduced. When the vertical height 230H of the recess 230 is greater than 100 μm, the interposer 200 may be damaged.

Referring to FIG. 1, and as further shown in FIGS. 7-8, a distance 900o in the vertical direction between a bottom surface 253 of the outer portion 207 of the interposer 200 and a top surface 101a of the first package substrate 101 is less than a distance 900c in the vertical direction between a top surface 139 of the first semiconductor chip 130 and the top surface 101a of the first package substrate 101.

Figure 9D:
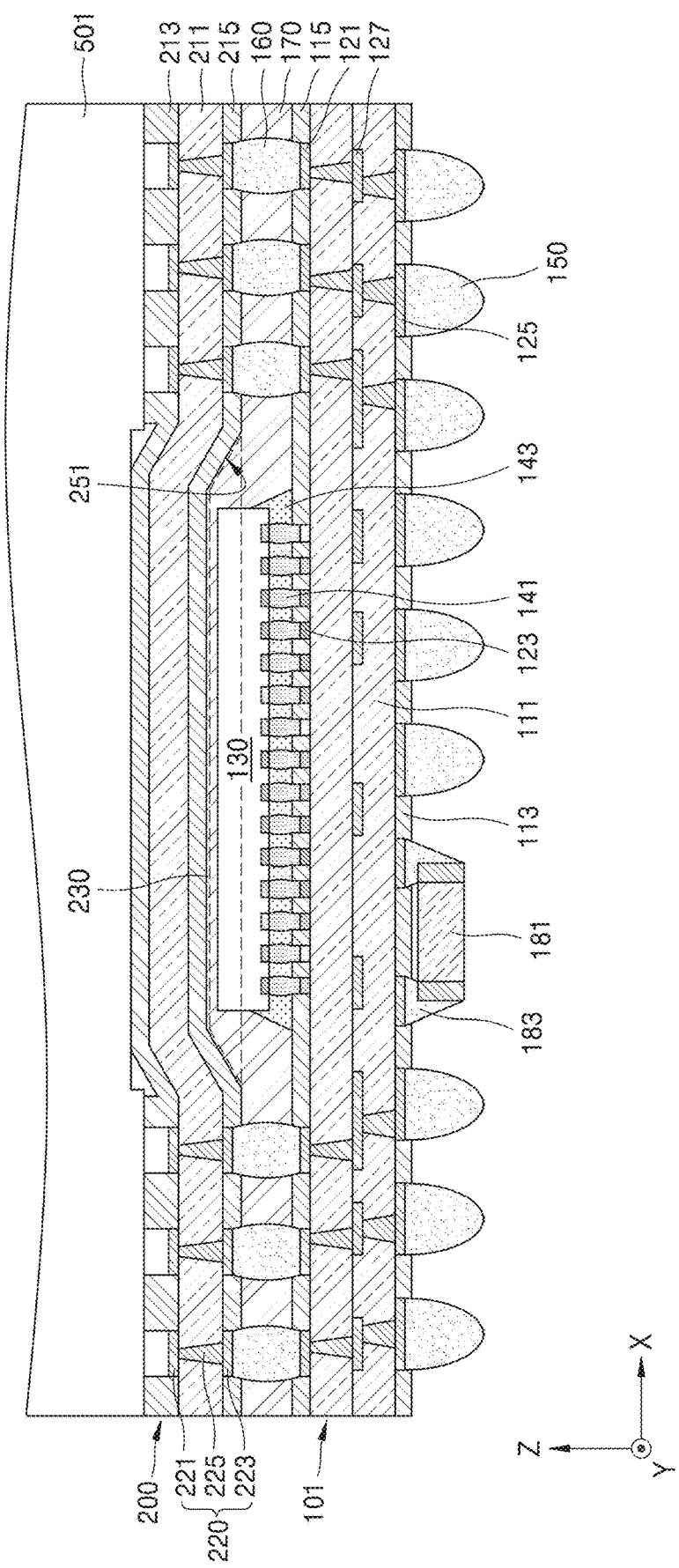

Referring to FIGS. 2 and 9D, the insulating filler 170 filling between the first package substrate 101 and the interposer 200 may be formed. For example, the insulating filler 170 may be formed by supplying an appropriate amount of a filling material between the first package substrate 101 and the interposer 200 using an injection process and hardening the filling material using a hardening process. In some example embodiments, the filling material for the insulating filler 170 may include epoxy-group molding resin or polyimide-group molding resin. For example, the filling material for the insulating filler 170 may include an EMC. The upper protective insulating layer 213 in the outer portion 207 of the interposer 200 is relatively thick and may thus function as a dam, which prevents the filling material from flowing into a space between the outer portion 207 of the interposer 200 and the mold 501 during the formation of the insulating filler 170.

Figure 9E:
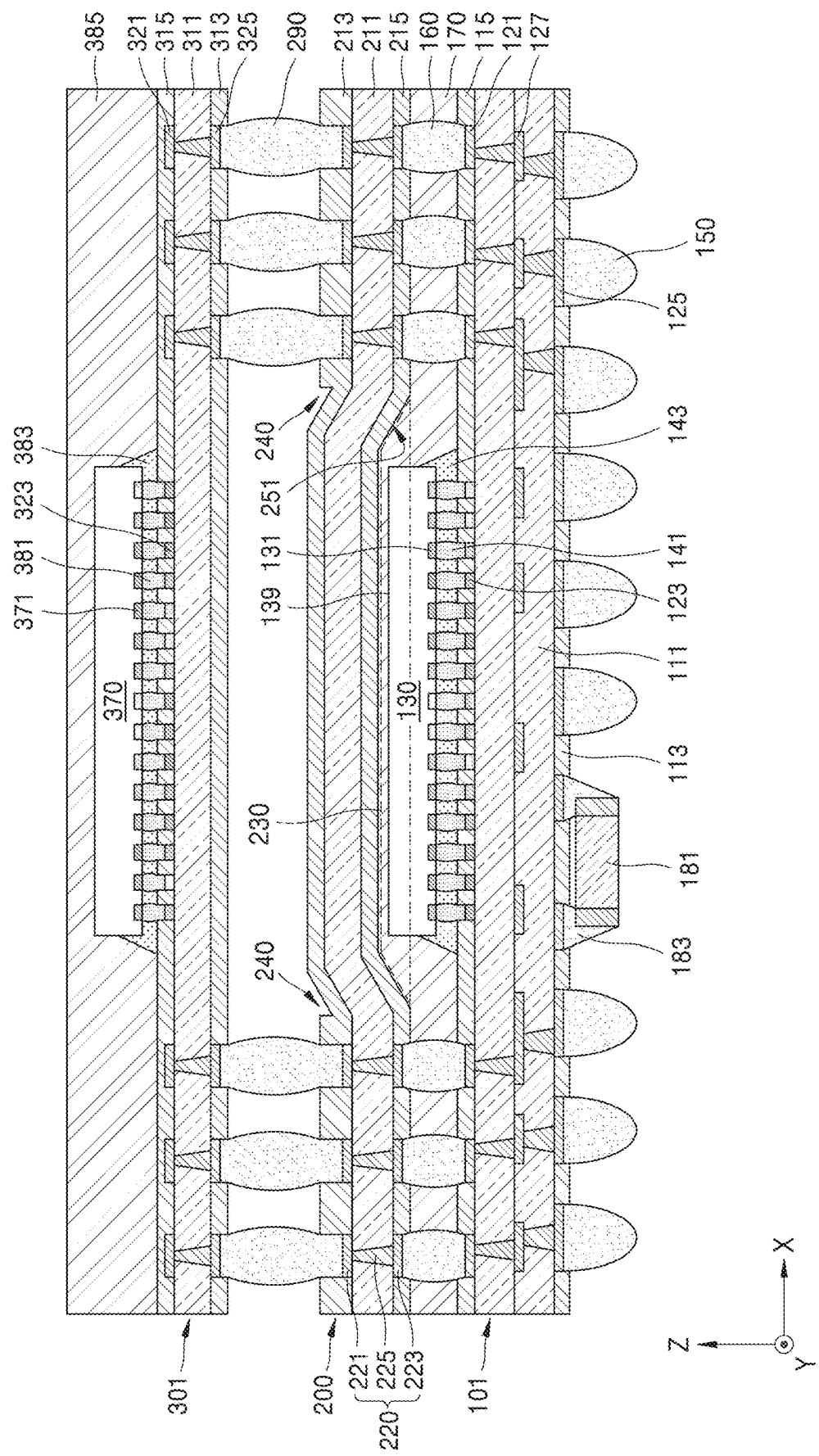

Referring to FIG. 9E, the upper package (400U of FIG. 7) is mounted on the interposer 200 using the second conductive connectors 290 arranged on the outer portion 207 of the interposer 200. As the upper package 400U is mounted on the interposer 200, a semiconductor package of a package-on-package type implemented using the interposer 200 may be completely formed.

According to some example embodiments, because of the interposer 200 having a bent structure, in which the outer portion 207 is closer to the first package substrate 101 than the central portion 201, the first conductive connectors 160 electrically connecting the interposer 200 to the first package substrate 101 may be arranged at a fine pitch, and the thickness of a semiconductor package using the interposer 200 may be reduced.

While the inventive concepts have been particularly shown and described with reference to some example embodiments thereof, it will be understood that various changes in form and details may be made therein without departing from the spirit and scope of the following claims.

What is claimed is:

1. A semiconductor package, comprising:
   a first package substrate;
   a first semiconductor chip on the first package substrate;
   a first conductive connector on the first package substrate; and
   an interposer, the interposer including
      a central portion on the first semiconductor chip, and
      an outer portion contacting the first conductive connector,
   wherein the central portion of the interposer includes a bottom surface facing the first semiconductor chip, the bottom surface defining a recess from a bottom surface of the outer portion of the interposer in a vertical direction that is perpendicular to a top surface of the first package substrate,
   a thickness in the vertical direction of the outer portion of the interposer is greater than a thickness in the vertical direction of the central portion of the interposer, and
   wherein the central portion protrudes upwardly from the outer portion, so that a top surface of the outer portion is at a lower level than a top surface of the central portion in the vertical direction.

2. The semiconductor package of claim 1, wherein the top surface of the central portion of the interposer and the top surface of the outer portion of the interposer collectively define a groove in a top surface of the interposer at a border between the top surface of the central portion of the interposer and the top surface of the outer portion of the interposer.

3. The semiconductor package of claim 1, wherein the central portion of the interposer includes:
   a first portion overlapping a top surface of the first semiconductor chip in the vertical direction; and
   a second portion extending with a slope between the first portion and the outer portion of the interposer.

4. The semiconductor package of claim 1, wherein the interposer includes:
   a base insulating layer;
   an upper protective insulating layer on a top surface of the base insulating layer; and
   a lower protective insulating layer on a bottom surface of the base insulating layer, and
   a thickness in the vertical direction of the upper protective insulating layer in the outer portion of the interposer is greater than a thickness in the vertical direction of the upper protective insulating layer in the central portion of the interposer.

5. The semiconductor package of claim 4, wherein the thickness in the vertical direction of the upper protective insulating layer in the outer portion of the interposer is greater than a thickness in the vertical direction of the lower protective insulating layer in the outer portion of the interposer.

6. The semiconductor package of claim 4, wherein the thickness in the vertical direction of the upper protective insulating layer in the outer portion of the interposer is between about 15 µm and about 40 µm.

7. The semiconductor package of claim 4, wherein the interposer further includes a spacer protruding from the lower protective insulating layer in the central portion of the interposer toward the first semiconductor chip.

8. The semiconductor package of claim 1, wherein a portion of the first semiconductor chip is at least partially located in the recess of the central portion of the interposer.

9. The semiconductor package of claim 8, wherein a height of the recess in the vertical direction is between about 10 µm and about 100 µm.

10. The semiconductor package of claim 1, further comprising:
    a second conductive connector on the outer portion of the interposer;
    a second package substrate on the interposer through the second conductive connector; and
    a second semiconductor chip on the second package substrate.

11. The semiconductor package of claim 10, wherein
    the second package substrate includes a central portion and an outer portion contacting the second conductive connector, and
    a bottom surface of the central portion of the second package substrate defines a recess from a bottom surface of the outer portion of the second package substrate in the vertical direction, the bottom surface of the central portion of the second package substrate facing the interposer.

12. The semiconductor package of claim 10, wherein the interposer further includes
    an upper conductive pad connected to the second conductive connector; and
    a dam structure extending along an edge of the upper conductive pad.

13. A semiconductor package, comprising:
    a first package substrate;
    a first semiconductor chip on the first package substrate;
    a first conductive connector on the first package substrate and isolated from direct contact with the first semiconductor chip;
    an interposer, the interposer including
       a central portion on the first semiconductor chip, and
       an outer portion contacting the first conductive connector;
    an insulating filler between the first package substrate and the interposer, the insulating filler being in contact with both the first semiconductor chip and the first conductive connector;
    a second conductive connector on the outer portion of the interposer;
    a second package substrate on the interposer through the second conductive connector; and
    a second semiconductor chip on the second package substrate,
    wherein a distance in a vertical direction between a bottom surface of the outer portion of the interposer and a top surface of the first package substrate is less than a distance in the vertical direction between a top surface of the first semiconductor chip and the top surface of the first package substrate, the vertical direction being perpendicular to the top surface of the first package substrate, a top surface of the central portion of the interposer and a top surface of the outer portion of the interposer collectively define a groove in a top surface of the interposer at a border between the top surface of the central portion of the interposer and the top surface of the outer portion of the interposer, and wherein the central portion protrudes upwardly from the outer portion, so that a top surface of the outer portion is at a lower level than a top surface of the central portion in the vertical direction.

14. The semiconductor package of claim 13, wherein the interposer includes:

a base insulating layer;

a lower conductive pad on a bottom surface of the base insulating layer and connected to the first conductive connector;

a lower protective insulating layer on the bottom surface of the base insulating layer and including one or more inner surfaces that at least partially define a lower opening that is at least partially filled with the first conductive connector;

an upper conductive pad on a top surface of the base insulating layer and connected to the second conductive connector; and an upper protective insulating layer on the top surface of the base insulating layer and including one or more inner surfaces that at least partially define an upper opening that is at least partially filled with the second conductive connector.

15. The semiconductor package of claim 14, wherein a thickness in the vertical direction of the upper protective insulating layer in the outer portion of the interposer is greater than a thickness in the vertical direction of the upper protective insulating layer in the central portion of the interposer.

16. The semiconductor package of claim 14, wherein the interposer further includes a plurality of spacers protruding from the lower protective insulating layer toward the top surface of the first semiconductor chip.

17. The semiconductor package of claim 14, wherein the upper protective insulating layer includes a dam structure extending along an edge of the upper conductive pad and at least partially defining the upper opening.

18. The semiconductor package of claim 14, wherein the second package substrate includes a central portion and an outer portion, the central portion of the second package substrate protrudes from the outer portion of the second package substrate in a direction away from the interposer, and a bottom surface of the central portion of the second package substrate defines a recess from a bottom surface of the outer portion of the second package substrate in the vertical direction, the bottom surface of the central portion of the second package substrate facing the interposer.

19. An interposer for a semiconductor package, the interposer comprising:

an outer portion including lower conductive pads at a bottom surface of the outer portion and upper conductive pads at a top surface of the outer portion; and a central portion protruding upwardly from the outer portion in a vertical direction, so that the top surface of the outer portion is at a lower level than a top surface of the central portion in the vertical direction that is perpendicular to the top surface of the outer portion, the central portion including a bottom surface defining a recess from the bottom surface of the outer portion in the vertical direction, wherein a thickness in the vertical direction of the outer portion is greater than a thickness in the vertical direction of the central portion, and the top surface of the central portion and the top surface of the outer portion collectively define a groove in a top surface of the interposer at a border between the top surface of the central portion and the top surface of the outer portion.

20. The interposer of claim 19, further comprising:

a base insulating layer;

an upper protective insulating layer on a top surface of the base insulating layer and including inner surfaces that at least partially define separate, respective upper openings exposing the upper conductive pads; and a lower protective insulating layer on a bottom surface of the base insulating layer and including inner surfaces that at least partially define separate, respective lower openings exposing the lower conductive pads, wherein a thickness in the vertical direction of the upper protective insulating layer in the outer portion of the interposer is greater than a thickness in the vertical direction of the upper protective insulating layer in the central portion of the interposer.

* * * * *